United States Patent [19]
Chiyo et al.

[11] Patent Number: 6,100,545
[45] Date of Patent: Aug. 8, 2000

[54] GAN TYPE SEMICONDUCTOR DEVICE

[75] Inventors: Toshiaki Chiyo; Shizuyo Noiri, both of Inazawa; Naoki Shibata, Bisai; Jun Ito, Inazawa, all of Japan

[73] Assignee: Toyoda Gosei Co., Ltd., Aichi, Japan

[21] Appl. No.: 09/170,128

[22] Filed: Oct. 13, 1998

[30] Foreign Application Priority Data

Oct. 10, 1997 [JP] Japan .................................. 9-293463
Oct. 10, 1997 [JP] Japan .................................. 9-293465
Mar. 31, 1998 [JP] Japan .................................. 10-105432

[51] Int. Cl.[7] .................................................. H01L 33/00
[52] U.S. Cl. .............................................. 257/98; 438/29
[58] Field of Search .................................. 257/98

[56] References Cited

U.S. PATENT DOCUMENTS

| | | | |
|---|---|---|---|
| 4,857,415 | 8/1989 | Tustison et al. | 428/620 |
| 5,641,582 | 6/1997 | Nire et al. | 428/690 |
| 5,828,088 | 10/1998 | Mauk | 257/98 |
| 5,977,604 | 11/1999 | Babic et al. | 257/466 |

*Primary Examiner*—Olik Chaudhari
*Assistant Examiner*—Douglas A. Wille
*Attorney, Agent, or Firm*—Pillsbury Madison & Sutro Intellectual Property Group

[57] ABSTRACT

A GaN type semiconductor layer having a new structure is provided which incorporates a substrate having surface which is opposite to a GaN type semiconductor layer and which is made of Ti.

8 Claims, 20 Drawing Sheets

- 48: p ELECTRODE
- 47: LIGHT TRANSMISSIVE ELECTRODE
- 46: p CLAD LAYER
- 45: LIGHT EMITTING LAYER
- 44: n CLAD LAYER
- 43: BUFFER LAYER (AlGaN)
- 42: Ti LAYER
- 41: SUBSTRATE (Si)

- 58: n ELECTRODE
- 44: n CLAD LAYER
- 45: LIGHT EMITTING LAYER
- 46: p CLAD LAYER
- 43: BUFFER LAYER (AlGaN)
- 42: Ti LAYER
- 41: SUBSTRATE (Si)

GAN TYPE SEMICONDUCTOR DEVICE

BACKGROUND OF THE INVENTION

The present invention relates to a GaN semiconductor and/or its related material's device (AlGaInN semiconductor device).

A fact has been known that the GaN type semiconductor device can be employed as, for example, a blue light emitting device. A light emitting device of the foregoing type incorporates a substrate usually made of sapphire.

The sapphire substrate has the following problems which must be solved. That is, since the sapphire substrate is transparent, light emitted from the light emitting device and required to be extracted from the upper surface of the device undesirably penetrates the sapphire substrate which is formed in the opposite surface of the device. Therefore, light emitted by the light emitting device cannot effectively be used.

Moreover, the sapphire substrate is still an expensive substrate.

In addition, since the sapphire substrate is an insulating material, the electrodes must be formed on same side of the substrate. Thus, a portion of the semiconductor layer must be etched. It leads to a fact that the bonding process is doubled. Since both of n and p electrodes are formed on one side, reduction in the size of the device has been limited. What is worse, a problem of charge up arises.

Although use of a Si (silicon) substrate in place of the sapphire substrate may be considered, growth of a high quality AlGaInN semiconductor layer on the Si substrate is very difficult. One of causes is the difference in the coefficient of thermal expansion between Si and the GaN type semiconductor. In contrast with the linear coefficient of thermal expansion of Si which is $4.7 \times 10^{-6}$/K, the linear coefficient of thermal expansion of CaN is $5.59 \times 10^{-6}$/K which is larger than the former value. Therefore, if the GaN semiconductor layer on Si is cooled after it is grown, the Si substrate is expanded. Thus, the device is deformed such that the semiconductor layer portion of the GaN is compressed. There is apprehension that tensile stress is generated and thus a crack is formed. Even if no crack is formed, lattices are distorted. Therefore, a required function of the AlGaInN type semiconductor device cannot be exhibited.

SUMMARY OF THE INVENTION

In view of the foregoing, an object of the present invention is to provide a new AlGaInN semiconductor device.

Another object of the present invention is to provide a laminated material which serves as an intermediate material of an AlGaInN semiconductor device and which has a new structure.

Accordingly, inventors of the present invention have made energetic studies to found a new substrate on which an AlGaInN semiconductor layer can satisfactorily be grown. As a result, the following facts are found.

That is, to heteroepitaxial grow a AlGaInN semiconductor on a substrate, at least two factors of the five factors below must be satisfied:

(1) Excellent adhesiveness between the AlGaInN type semiconductor and the substrate is required.

(2) The coefficients of thermal expansion of the AlGaInN semiconductor and the substrate must be close to each other.

(3) The substrate must have a low elastic modulus.

(4) The crystalline structure of the substrate must be the same as that of the AlGaInN semiconductor.

(5) lattice constant of the substrate—lattice constant of the AlGaInN semiconductor lattice constant of the AlGaInN semiconductor $\leq 0.05$ must be satisfied (that is, the difference between the lattice constant of the substrate and the lattice constant of the AlGaInN semiconductor layer must be ±5% or lower).

As a matter of course, it is preferable that at least three factors of the five factors are satisfied, more preferably at least four factors are satisfied and most preferably all of the five factors are satisfied.

As a material which is capable of satisfying the above-mentioned factors, some metal materials are paid attention. Among the metal materials, Ti is paid attention especially.

The substrate must have a structure that at least its surface, that is, a surface which is in contact with the AlGaInN semiconductor layer must satisfy the foregoing factors.

Therefore, the base material of the substrate may be made of an appropriate material and the surface portion of the substrate may be made of a material which is able to satisfy the above-mentioned factors.

Similarly to the sapphire substrate, a buffer layer made of $Al_aInbGa1-\alpha-bN$ (including a=0, b=0 or a a=b=0), such as AlN or GaN, may be interposed between the semiconductor layer and the substrate.

On the other hand, a semiconductor device can be constituted which has a structure that a buffer layer for buffering stress is interposed between the Si substrate and the AlGaInN semiconductor layer. As a material for constituting the buffer layer for buffering stress, some metal materials are paid attention. Among the materials, Ti is paid attention especially. That is, a semiconductor device has a structure that a Ti layer is formed on a Si substrate and a GaN type semiconductor layer is formed on the Ti layer.

The present invention has been found on the basis of the aforementioned matters. That is, according to a first aspect of the present invention, there is provided an AlGaInN type semiconductor device comprising:

an AlGaInN type semiconductor layer;

a substrate having a surface which is contact to the semiconductor layer and which is made of Ti.

If the thus-structured semiconductor device has a structure that the AlGaInN type semiconductor layer has a structure of the light emitting device, the substrate serves as a reflecting layer. Therefore, light emitted by the device can effectively be used.

Thus, an individual reflecting layer which has been required for a light omitting device or a light receiving device such as sensor or solar cell incorporating a transparent sapphire substrate is not required. Moreover, a necessity of removing a process for removing a substrate can be eliminated in a case where the substrate is made of a material, such as GaAs, which absorbs light.

The AlGaInN semiconductor is a nitride semiconductor in a group III generally expressed by $Al_xGa_YIn_{1-x-y}N$ ($0 \leq X \leq 1$, $0 \leq Y \leq 1$, $0 \leq X+Y \leq 1$). An appropriate dopant may be contained.

Each of the light emitting device has a known structure in which a light emitting layer is interposed between the different conductive semiconductor layers (clad layers). The light emitting layer is used a superlattice structure or a double hetero structure.

An electronic device such as an FET (Field Effect Transistor) may be formed by an AlGaInN semiconductor.

The AlGaInN semiconductor layer is formed by a known metal organic chemical vapor deposition method (hereinafter called a "MOCVD"). Also a known molecular beam epitaxy (an MBE method) may be employed.

The substrate must have a structure that its surface, that is, the surface which is contact to the AlGaInN type semiconductor layer and which is made of Ti. Therefore, at least the surface layer of the substrate may be made of Ti and the lower layer (the base layer) may be made of an appropriate material. Another structure may be employed in which the base layer is made of a Ti material or a Ti alloy. Moreover, the surface layer is formed by Ti having a high quality.

It is preferable that the surface contact to the AlGaInN semiconductor layer is made of single crystal Ti. Under condition that the crystalline structure is substantially maintained, Ti may be replaced by the Ti alloy. Maintaining the crystalline structure means that the Ti alloy has the c plane such as (111) or (000) like Ti.

It is preferable that the overall body of the substrate has an electric conductivity. If the substrate has the electric conductivity, current can be supplied to the AlGaInN type semiconductor layer through the substrate by connecting an electrode to the substrate. Therefore, complicated etching of the semiconductor layer which has been required to constitute the light emitting device or the light receiving device by the AlGaInN type semiconductor layer can be eliminated. In an example shown in FIG. 21, the n clad layer can electrically be connected to the outside through the substrate. In a case of the sapphire conventional substrate which is an insulating substrate, the light emitting layer and the p clad layer must be etched so as to be exposed and electrically connected to the outside.

Since supply of current from the substrate to the semiconductor layer is permitted, bonding to an external power source can easily be performed.

If an electrical earth is established, the problem of charge up can easily be overcome.

To make the substrate to be electrically conductive, the base layer of the substrate is made of an electrically conductive metal material, such as Cr, Hf, Nb, Re, Ta, Ti, V, Zr or Y or Si, GaAs, GaP, InP, ZnO or ZnSe.

The thus-formed base layer is subjected to CVD (Chemical Vapour Deposition), such as plasma CVD, thermal CVD or light CVD, or sputtering or evaporation (Physical Vapour Deposition) so that a Ti layer is formed.

DETAILED DESCRIPTION OF THE PREFERRED EMBODIMENTS

An embodiment of the present invention has a structure that sapphire is employed to form a base layer of a substrate. Moreover, single crystal Ti layer is evaporated on the surface of the sapphire base layer.

Figure 1:
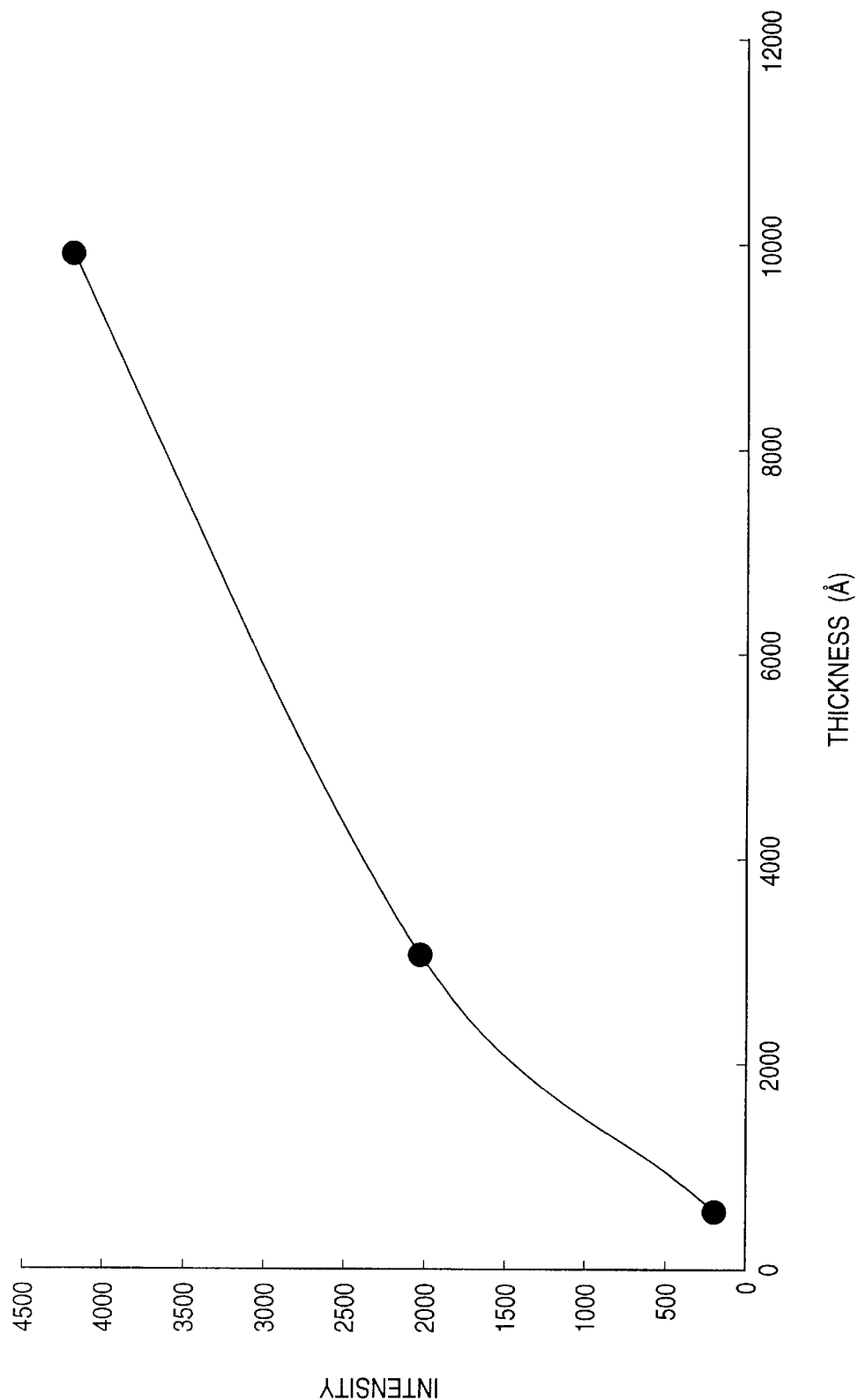
FIG. 1 is a graph showing dependency of the crystallinity of a Ti layer evaporated on a sapphire base layer on the thickness.

FIG. 1 shows dependency of the crystallinity of single crystal Ti on the thickness.

Conditions under which the results shown in FIG. 1 are obtained are as follows:

Evaporating Speed: 0.5 nm/s

Evaporation Temperature: 150° C.

Thickness: subjects which must be measured

The y axis of the graph shown in FIG. 1 stands for an average intensity (a relative value) of six peaks obtained by φ (PHI) scanning the Ti layer. The crystallinity is proportional to the intensity shown on the y axis. The thickness of Ti layer of measured sample is same. As a matter of course, the Ti layer which is a base layer of the AlGaInN semiconductor layer must have high crystallinity to improve the crystallinity of the AlGaInN type semiconductor layer. The φ (PHI) shows six peaks corresponding to (101-2) planes of a hexagonal system when the sample is rotated by 360°.

As described above, the Ti layer on which six peaks have been observed by the φ (PHI) scan is considered to be in the form of single crystal or close to the single crystal.

As for the φ (PHI) scan, refer to Journal of Electronic Materials, Vol. 25, No. 11, pp. 1740–1747, 1996.

To obtain the results shown in FIG. 1, the following pervious process is performed before the Ti layer is formed. When results shown in other drawings have been obtained, the process is performed.

The sapphire substrate is set in a chamber for evaporation, and then a vacuum pump which is usually employed in industrial fields is operated to produce a vacuum of $3\times10^{-5}$ Torr. Then, the chamber is filled with nitrogen gas. The above-mentioned process is repeated three times so that oxygen in the chamber is reduced and oxidation of Ti is prevented. Therefore, another method which is capable of sufficiently discharging oxygen from the chamber may be employed.

As a result of an investigation performed by the inventors, the above-mentioned nitrogen purge must be repeated because the degree of vacuum of a vacuum apparatus provided for an evaporating apparatus, which is usually employed in industrial fields, is limited (usually limited to $10^{-7}$ Torr). As a matter of course, another inert gas may be employed in place of the nitrogen gas.

Then, the pressure of the nitrogen gas is lowered to $8\times10^{-7}$ Torr.

After the foregoing previous process has been completed, the substrate is heated to a predetermined temperature with a lamp heater. Moreover, bulks of Ti are irradiated with electron beams so as to be melted so that single crystal Ti layer is formed on the sapphire base layer.

The φ (PHI) scan was performed by using a four-axis single crystal diffractometer (trade name: "X-pert" manufactured by Philips) (hereinafter identical).

Figure 2:
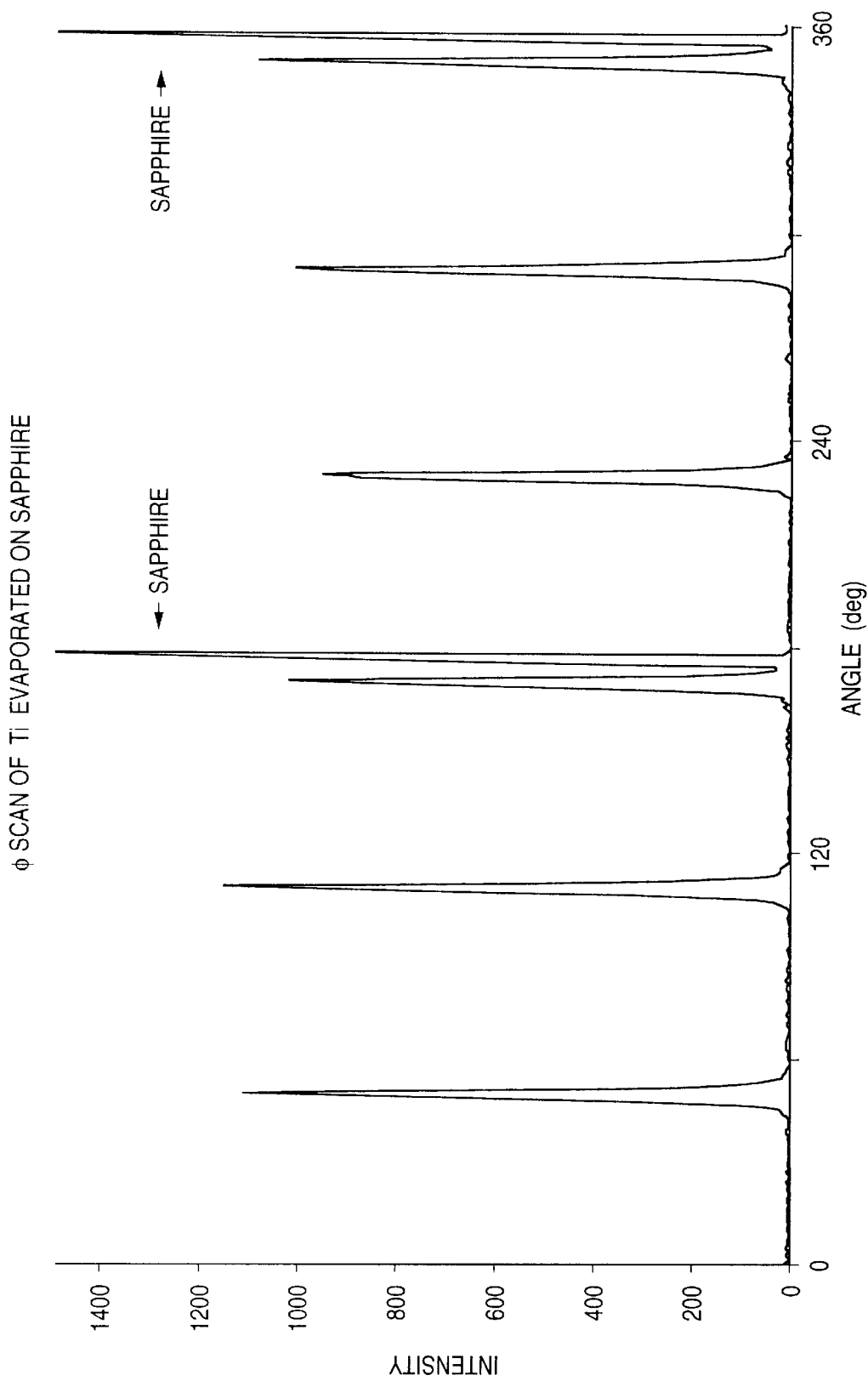
FIG. 2 is a chart showing results of φ (PHI) scan of the Ti layer evaporated on the sapphire base layer.

FIG. 2 shows an example of results of φ (PHI) scanning (when the thickness of the Ti layer: 300 nm). The averages (relative values) of intensities of six peaks corresponding to (101-2) planes of Ti allowed to appear in FIG. 2 are values of the axis of ordinate shown in FIG. 1.

In accordance with the results shown in FIG. 1, it is preferable that the thickness of the Ti layer which is formed on the surface of a material except for Ti is 1000 to 15000 angstrom (100 nm to 1500 nm). If the thickness of the Ti layer is smaller than 100 nm, satisfactory crystallinity cannot be obtained. The Ti layer is not required to have a thickness larger than 1500 nm. In this case, long time is required to form the film. If sufficiently long time is permitted, the necessity of determining an upper limit can be eliminated.

Since the Ti layer having the above-mentioned thickness is formed, a portion of light emitted by the GaN type semiconductor layer and discharged toward the substrate is reflected by the Ti layer. Thus, light penetration is inhibited. Therefore, light generated by the GaN type semiconductor layer is substantially fully extracted from the surface of the device. Thus, light can effectively be used.

More preferably, the thickness of the Ti layer is 2000 angstrom to 10000 angstrom (200 nm to 1000 nm).

Figure 3:
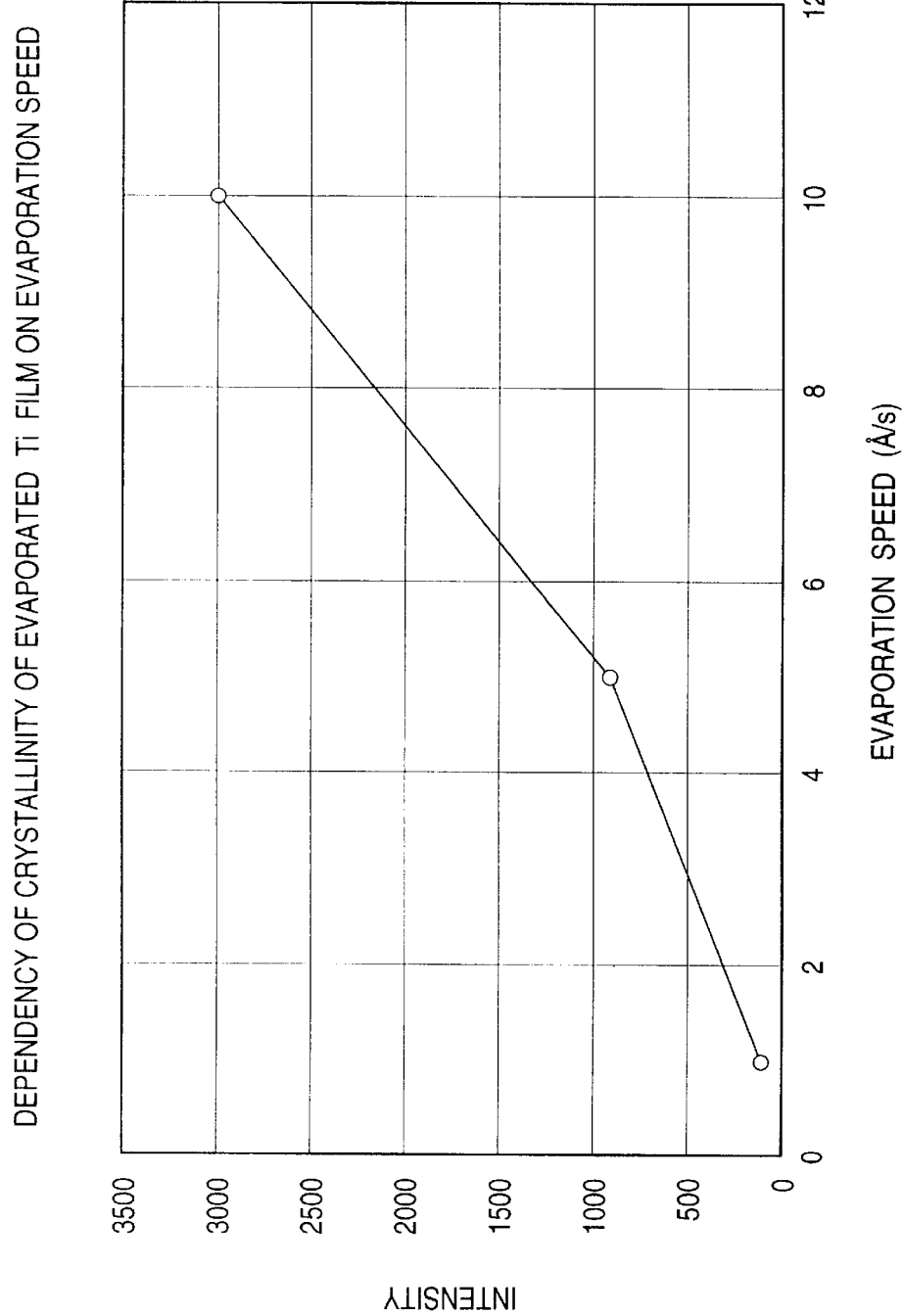
FIG. 3 is a graph showing dependency of the crystallinity of the Ti layer evaporated on the sapphire base layer on the evaporation speed.

FIG. 3 shows dependency of the crystallinity of the evaporated Ti film on the sapphire substrate.

The axis of ordinate of the graph stands for average intensities (relative values) obtained by the φ (PHI) scan.

Conditions under which the results shown in FIG. 3 are obtained are as follows:

Evaporating Speed: subjects which must be measured
Evaporation Temperature: 150° C.
Thickness: 300 nm As can be understood from the results shown in FIG. 3, it is preferable that the evaporating speed of the Ti layer is 0.5 nm/s or higher. Note that the evaporating speed of Ti which is 2 nm/s or higher is impractical because surface morphology deteriorates.

Figure 4:
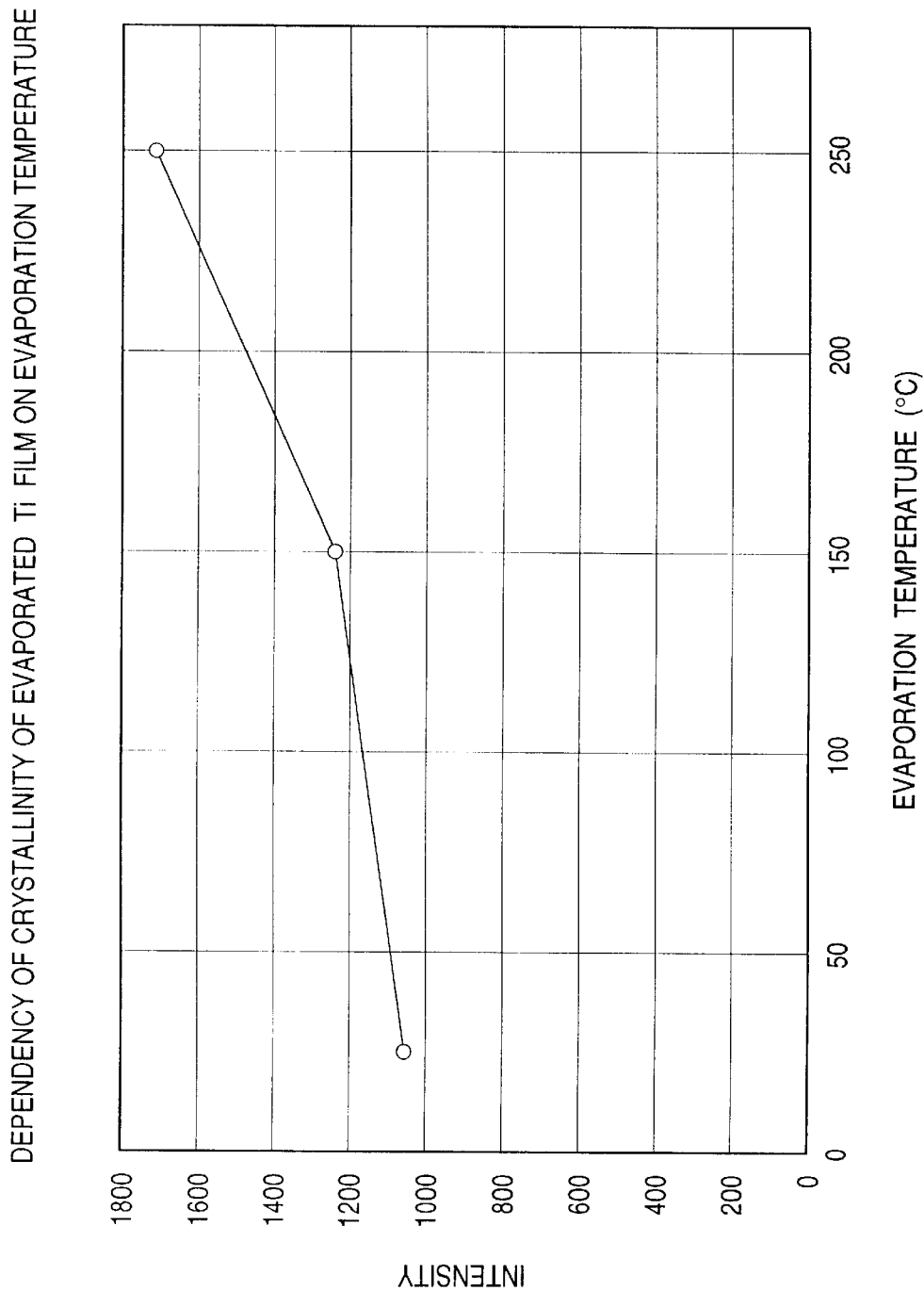
FIG. 4 is a graph showing dependency of the crystallinity of the Ti layer evaporated on the sapphire base layer on an evaporation temperature.

FIG. 4 shows dependency of the crystallinity of the evaporated Ti film on the evaporation temperature (the temperature of the substrate during the evaporation process) on the sapphire base layer. The axis of ordinate of the graph stands for average intensities (relative values) obtained by the φ (PHI) scan.

Conditions under which the Ti layer was formed when the results shown in FIG. 4 were as follows:

Evaporating Speed: 0.5 nm/s
Evaporation Temperature: subjects which must be measured
Thickness: 300 nm As can be understood from the results shown in FIG. 4, an expectation can be held that satisfactory crystallinity can be realized at room temperature to 350° C., more preferably 25° C. to 250° C., most preferably 150° C. to 250° C.

In accordance with an investigation made by the inventors of the present invention, it is preferable that the evaporation temperature is 130° C. to 170° C., more preferably 150° C. If the temperature is higher than 170° C., there is apprehension that orientation characteristic of Ti in the axis c deteriorates.

Figure 5:
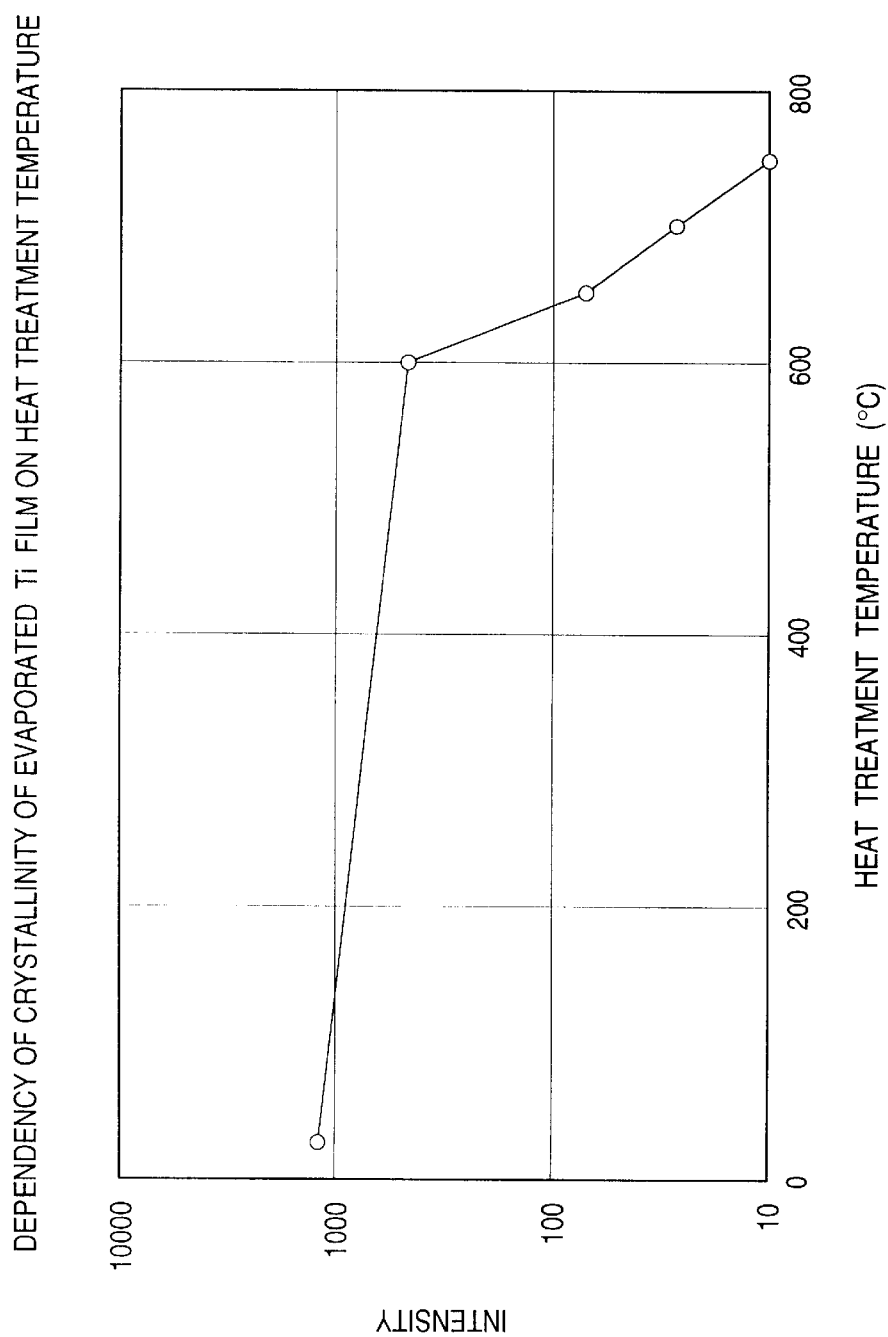
FIG. 5 is a graph showing the relationship between the crystallinity of the Ti layer and a heat treatment temperature when the Ti layer evaporated on the sapphire base layer has been subjected to heat treatment.

FIG. 5 shows dependency of the crystallinity of the evaporated Ti film on the heat treatment temperature on the sapphire substrate.

Conditions under which the Ti layer was formed when the results shown in FIG. 5 were as follows:

Evaporating Speed: 0.5 nm/s
Evaporation Temperature: 150° C.
Thickness: 300 nm

The thus-obtained Ti/sapphire was heated in a heating furnace to each temperature shown on the axis of abscissa (for five minutes).

Similarly to FIG. 1, the axis of ordinate of the graph stands for average intensities (relative values) obtained by the φ (PHI) scan.

As can be understood from the results shown in FIG. 5, the crystallinity deteriorates if the Ti layer on sapphire substrate is heated to a level higher than 750° C. Namely, it is preferable that the Ti layer is maintained at a temperature not higher than 750° C. until at least one AlGaInN semiconductor layer is formed on the Ti layer. After the first AlGaInN semiconductor layer has been formed, a second GaN type semiconductor layer can be formed on the first GaN type semiconductor layer. Therefore, the temperature at which the crystallinity of the first AlGaInN semiconductor layer can be maintained is a critical temperature. Even if the crystallinity of the Ti layer deteriorates at the foregoing critical temperature and the crystallinity of the first AlGaInN type semiconductor layer is maintained, the crystallinity of the second AlGaInN type semiconductor layer is not affected adversely.

As can be understood from the results shown in FIG. 5, it is preferable that the Ti layer is maintained at a temperature not higher than 600° C. until at least one AlGaInN type semiconductor layer is grown on the Ti layer.

Figure 6:
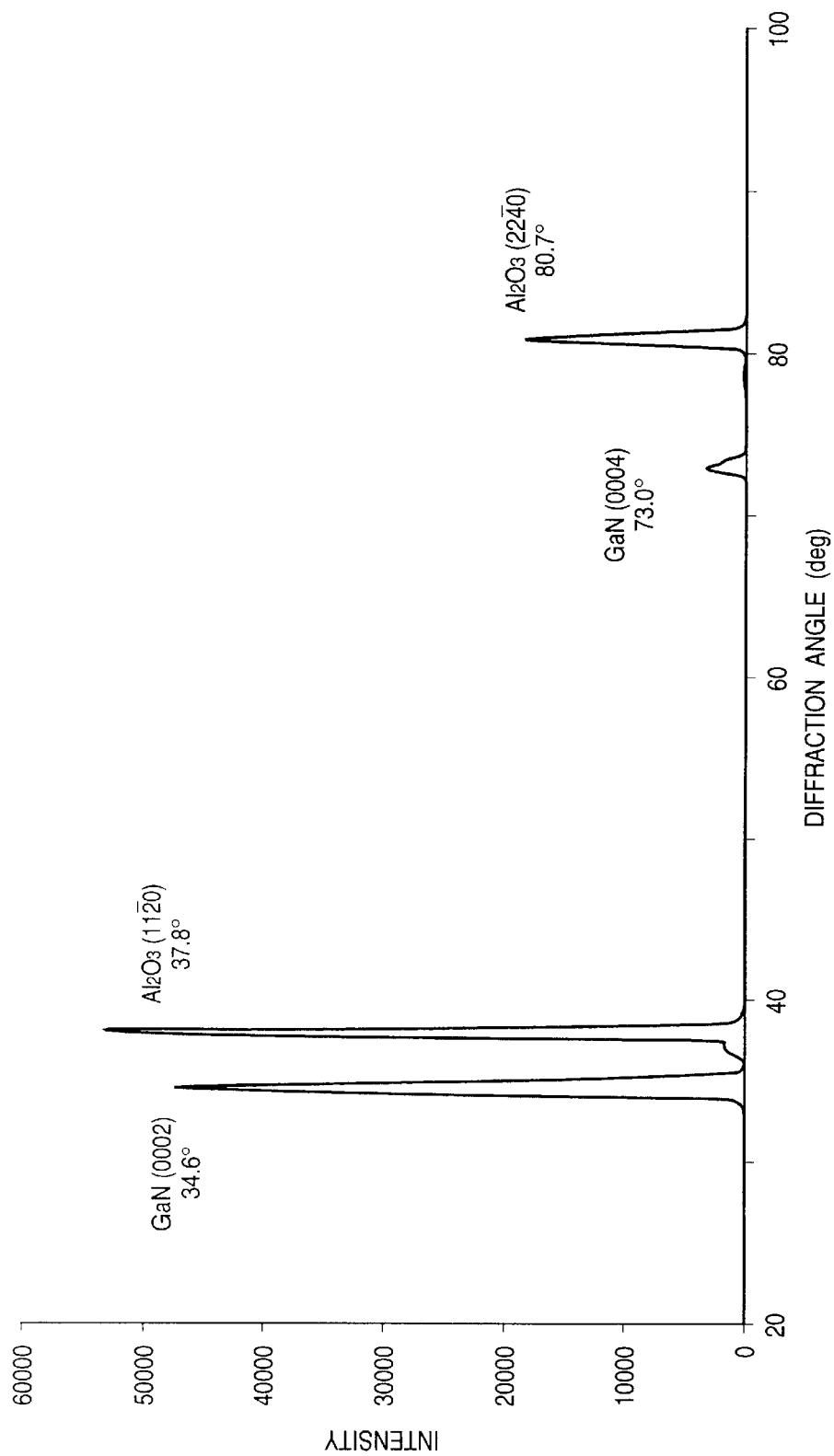
FIG. 6 is a chart showing results of 2θ-ω scan for evaluating the crystallinity of a GaN layer grown on an AlN buffer layer formed on the Ti layer formed on the sapphire base layer.

FIG. 6 shows results of 2θ-ω (2θ: 20° to 100°) scan performed for the purpose of evaluating the crystallinity of a GaN layer grown on an AlN buffer layer formed on the Ti layer formed on the sapphire bas layer. Also the 2θ-ω scan was performed with the four-axis single crystal diffractometer (trade name: X-pert manufactured by Philips) (hereinafter identical to following 2θ-ω scan).

Conditions under which the Ti layer was formed when the results shown in FIG. 6 were as follows:

Evaporating Speed: 0.5 nm/s

Evaporation Temperature: 150° C.

Thickness: 300 nm

The following measurement was performed such that the Ti layer was formed under the same conditions.

Before the AlN buffer layer was formed, the Ti/sapphire was heated at 600° C. for 5 minutes in a vacuum ($3 \times 10^{-5}$ Torr) (vacuum cleaning).

The AlN buffer layer was formed by the MOCVD method under the following conditions:

Pressure in Reaction Chamber: Atmospheric pressure

Temperature: 400° C.

Material Gas 1: Ammonia Material Gas 2: TMA

Carrier Gas: H2

The GaN layer was formed by the MOCVD method under the following conditions:

Pressure in Reaction Chamber: Atmospheric pressure

Temperature: 1000° C.

Material Gas 1: Ammonia

Material Gas 2: TMG

Carrier Gas: H2

Conditions under which the GaN layer is formed in the following cases are the same as those of the foregoing.

Figure 7:
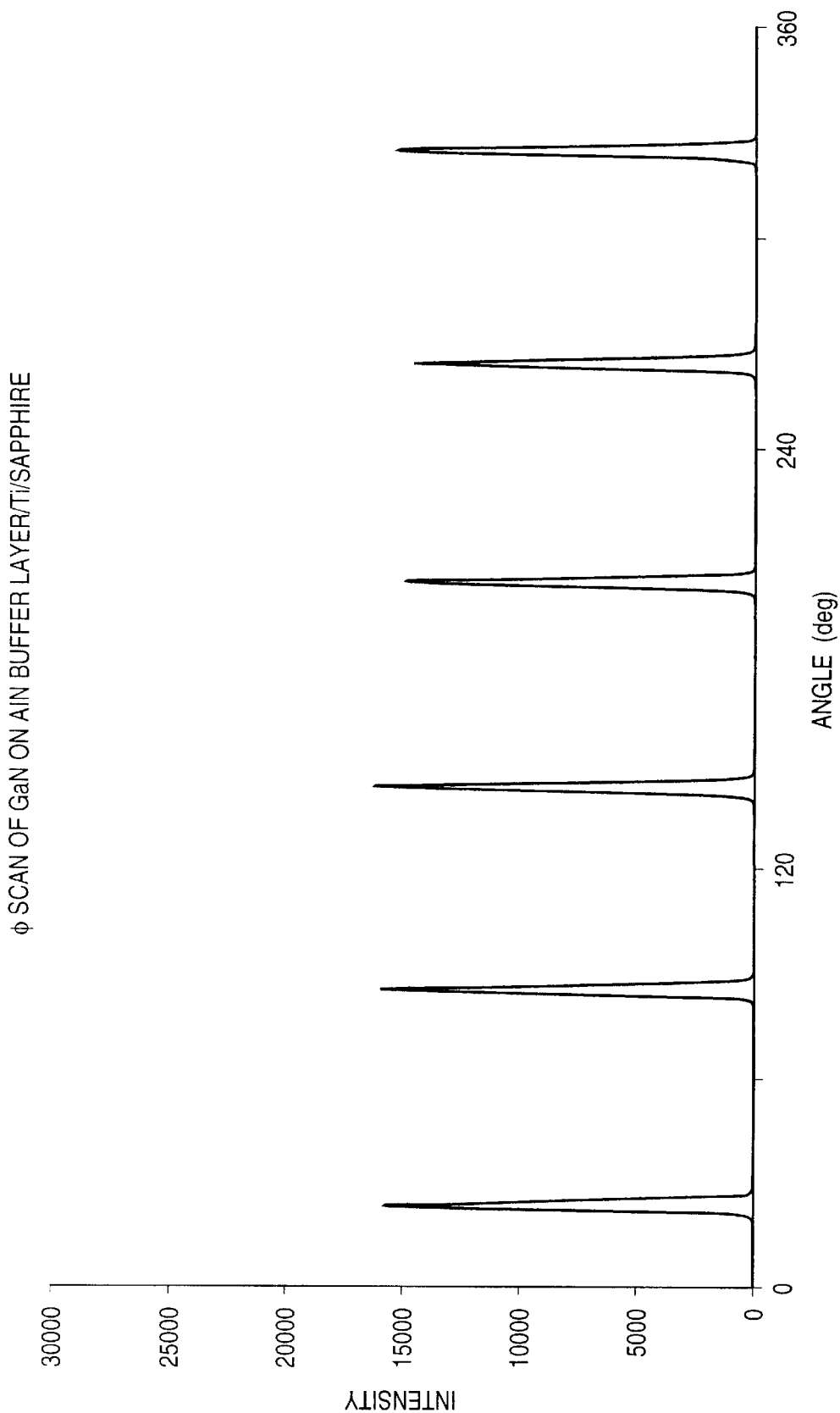
FIG. 7 is a chart showing results of φ (PHI) scan of the same sample as that shown in FIG. 6.

FIG. 7 shows results of φ (PHI) scanning of the same material as that shown in FIG. 6.

As can be understood from the results shown in FIGS. 6 and 7, GaN grown on the Ti/sapphire through the AlN buffer layer has preferred crystallinity. Therefore, when the AlGaInN type semiconductor layer is grown on the AlN/Ti/sapphire base layer, a semiconductor device, such as a light emitting device, which has a sapphire function can be formed by dint of the above-mentioned semiconductor layer.

Figure 8:
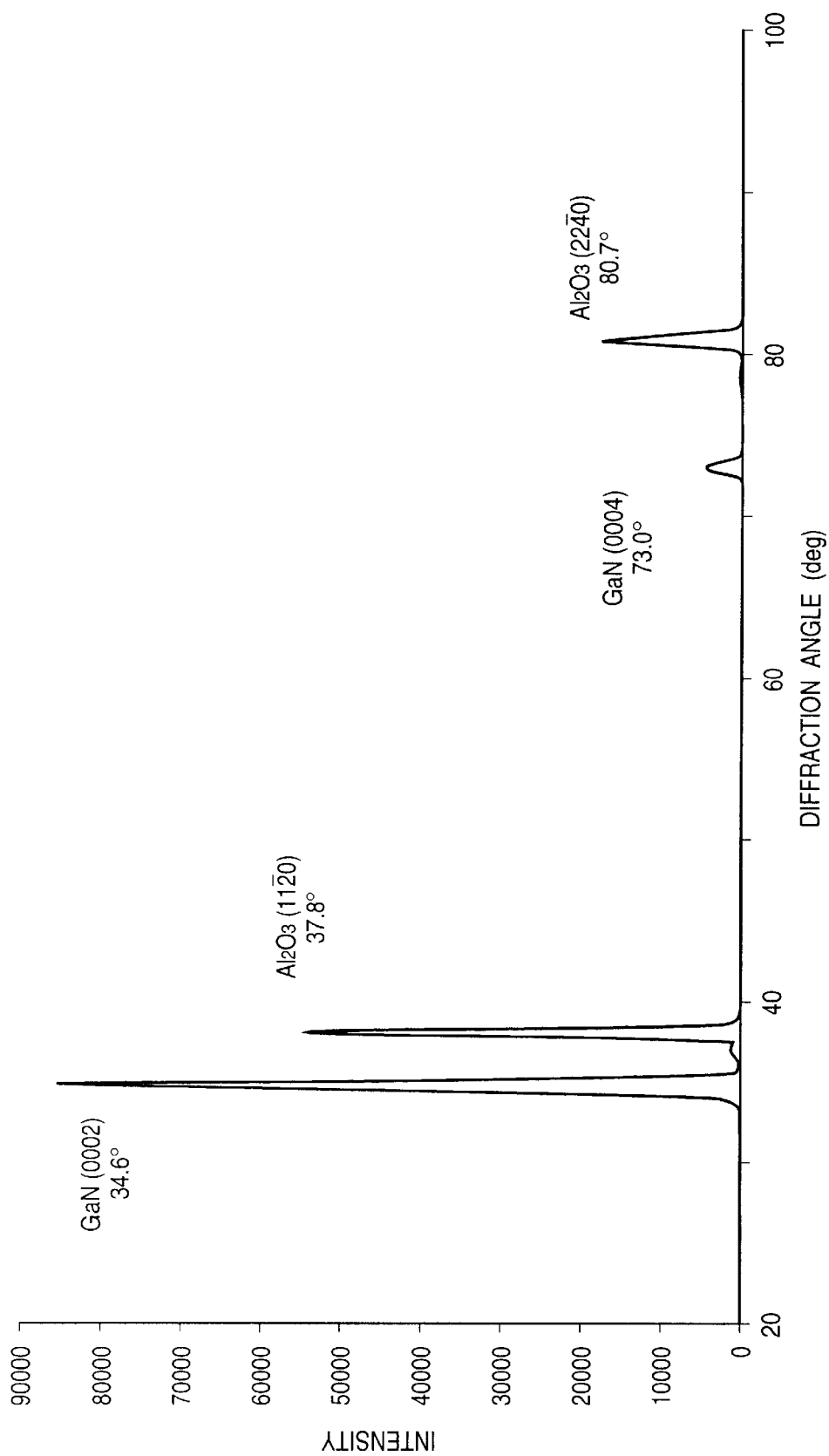
FIG. 8 is a chart showing results of 2θ-ω scan for evaluating the crystallinity of a GaN layer grown on an AlGaN buffer layer formed on the Ti layer formed on the sapphire base layer.

FIG. 8 shows results of 2θ-ω (2θ: 20° to 100°) scan performed for the purpose of evaluating the crystallinity of a GaN layer grown on a AlGaN buffer layer formed on the Ti layer formed on the sapphire base layer.

Before the AlGaN buffer layer was formed, the Ti/sapphire base layer was heated at 600° C. for 5 minutes in a vacuum ($3 \times 10^{-5}$ Torr) (vacuum cleaning).

The AlGaN buffer layer was formed by the MOCVD method under the following conditions:

Pressure in Reaction Chamber: Atmospheric pressure

Temperature: 300° C.

Material Gas 1: Ammonia

Material Gas 2: TMA

Material Gas 3: TMG

Carrier Gas: H2

The GaN layer was formed by the MOCVD method under the same conditions as those shown in FIGS. 6 and 7.

Figure 9:
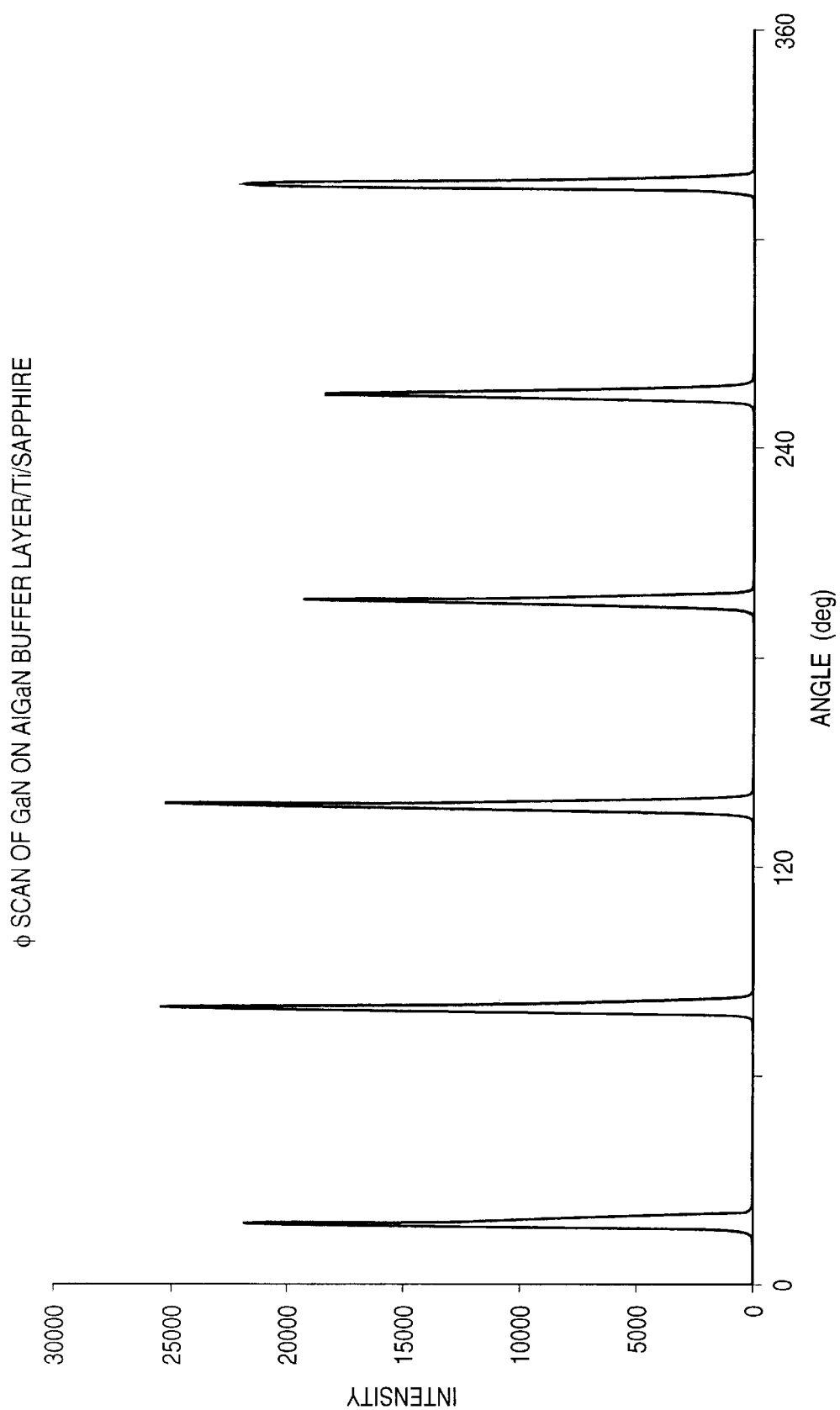
FIG. 9 is a chart showing results of φ (PHI) scan of the same sample as that shown in FIG. 8.

FIG. 9 shows results of φ (PHI) scan of the same material as those shown in FIG. 8.

As can be understood from the results shown in FIGS. 8 and 9, GaN grown on the Ti/sapphire through the AlGaN buffer layer has satisfactory crystallinity.

As can be understood from the results shown in FIGS. 6 and 7, the GaN layer formed on an AlGaN buffer layer has satisfactory crystallinity compared with GaN layer formed on an AlN buffer layer.

Figure 10:
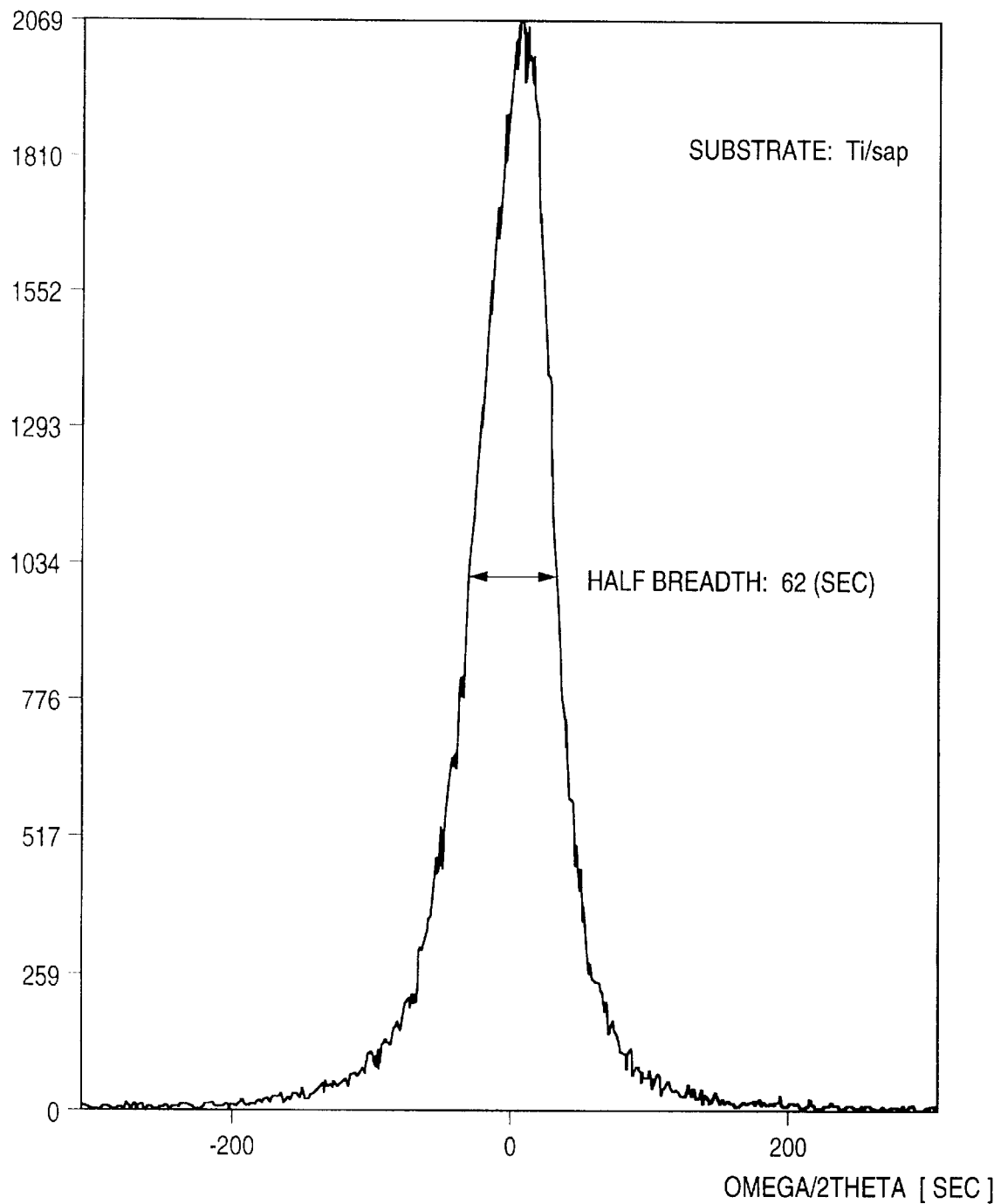
FIG. 10 is a chart showing a locking curve for evaluating the crystallinity of GaN grown on the Ti/sapphire through an AlGaN buffer layer.

FIG. 10 shows a locking curve for evaluating the crystallinity of GaN grown on the Ti/sapphire through the AlGaN buffer layer. As a result of the locking curve above, an ordinary skilled in the art is able to find a fact the foregoing GaN has satisfactory characteristics to serve as the semiconductor layer for constituting the light emitting device.

Figure 11:
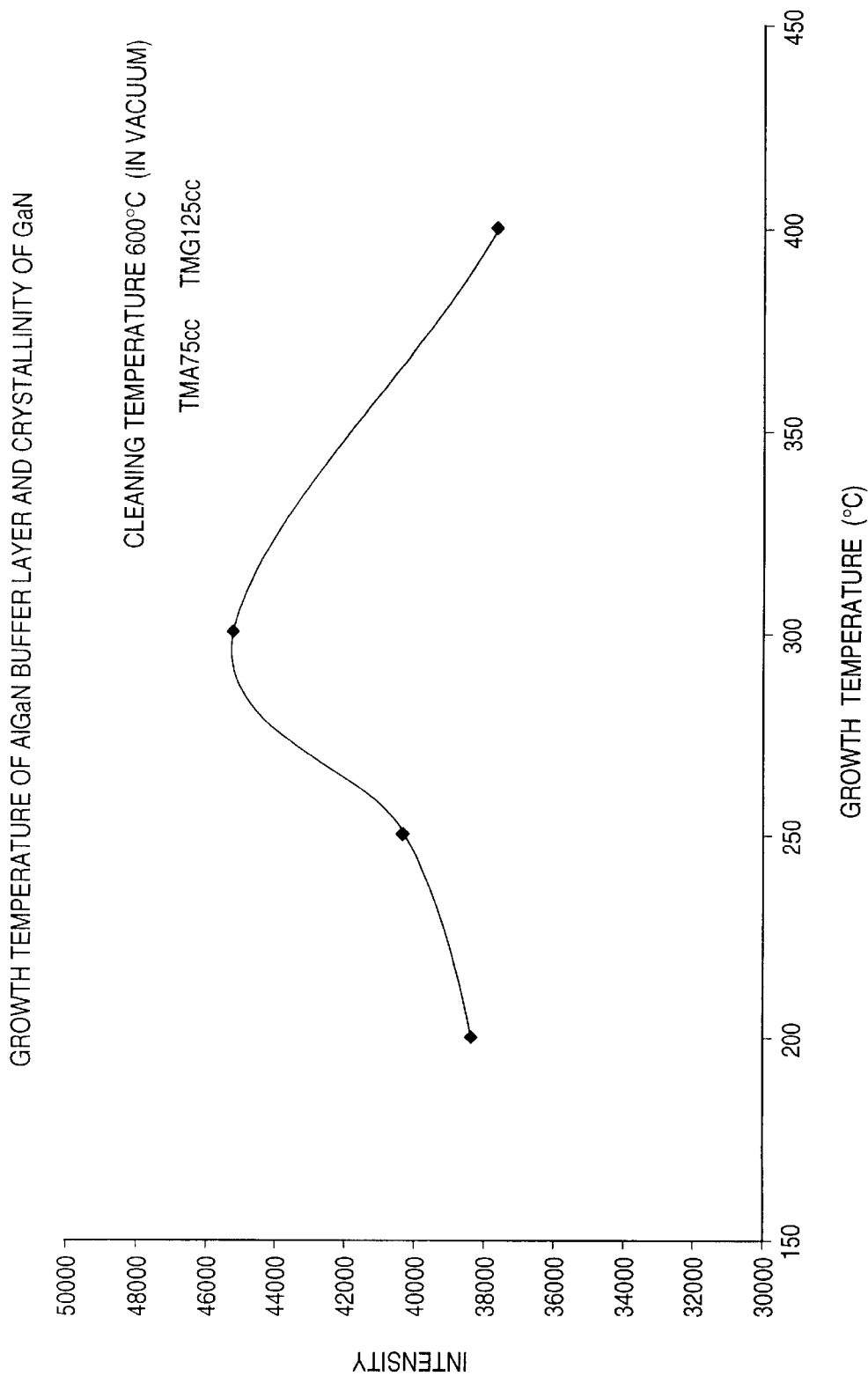
FIG. 11 is a graph showing the relationship between a growth temperature of the AlGaN buffer layer and the crystallinity of GaN.

FIG. 11 shows the relationship between the growth temperature of the AlGaN buffer layer and the crystallinity of GaN.

The axis of ordinate of the graph stands for average intensities (relative values) of six peaks obtained by the φ (PHI) scan similarly to that shown in FIG. 9.

The Ti layer was formed under the above-mentioned conditions.

The Ti layer was cleaned by making the inside portion of the chamber ($3 \times 10^{-5}$ Torr) at 600° C. for 5 minutes.

The AlGaN buffer layer was formed by the MOCVD method under the following conditions:

Pressure in Reaction Chamber: Normal pressure

Temperature: subject which must be measured

Material Gas 1: Ammonia

Material Gas 2: TMA

Material Gas 3: TMG

Carrier Gas: H2

Flow Rate (TMG/(TMG+TMA) of Carrier Gases: 0.625

As can be understood from the results shown in FIG. 11, it is preferable that the temperature at which the AlGaN buffer layer is grown is 250° C. to 350° C., more preferably 280° C. to 330° C., most preferably about 300° C.

Figure 12:
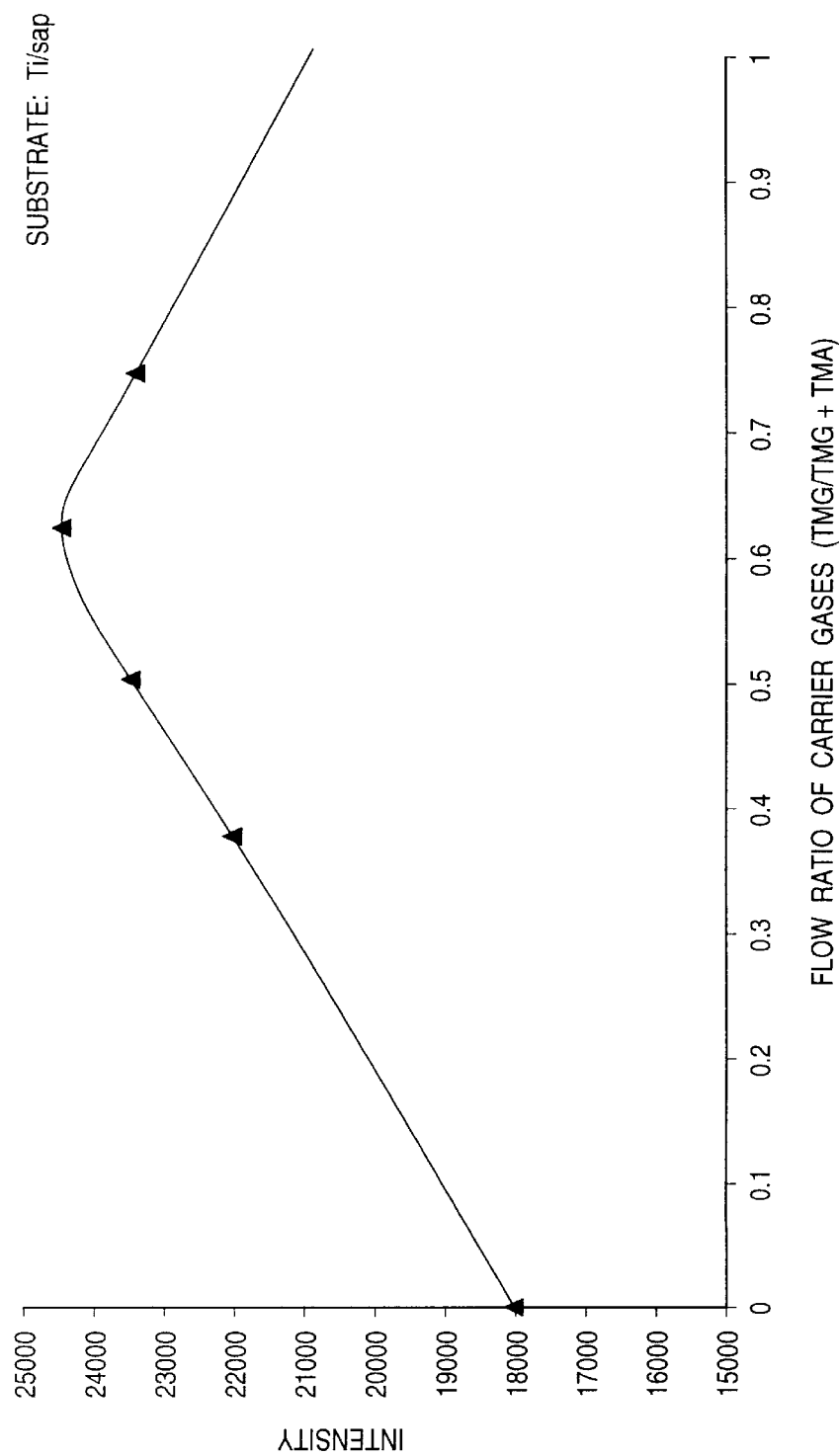
FIG. 12 is a graph showing the relationship between a gas flow ratio of TMG and TMA carrier gases for forming the AlGaN buffer layer and the crystallinity of GaN.

FIG. 12 shows the relationship between the flow rate ratio of TMG and TMA carrier gases when the AlGaN buffer layer is formed and the crystallinity of GaN. The axis of ordinate of the graph stands for average intensities (relative values) of six peaks obtained by the φ (PHI) scan similarly to that shown in FIG. 9.

The Ti layer was formed under the above-mentioned conditions.

The Ti layer was cleaned by making the inside portion of the chamber ($3 \times 10^{-5}$ Torr) at 600° C. for 5 minutes.

The AlGaN buffer layer was formed by the MOCVD method under the following conditions:

Pressure in Reaction Chamber: Normal pressure

Temperature: 300° C.

Material Gas 1: Ammonia

Material Gas 2: TMA

Material Gas 3: TMG

Carrier Gas: H2

Flow Rate (TMG/(TMG+TMA) of Carrier Gases: subject to be measured

The GaN layer was formed under the above-mentioned conditions.

As can be understood from the results shown in FIG. 12, it is preferable that the flow rate of the carrier gases is such that TMG/(TMG+TMA)=0.4 to 0.8. Therefore, it is preferable that the molar ratio of the material gases which are supplied into the reaction chamber is such that TMG/(TMG+TMA)=0.53 to 0.87, more preferably the flow rate= 0.5 to 0.7 (the molar ratio=0.63 to 0.80), most preferably the flow rate=0.60 to 0.65. It is considered at present that the most preferred flow rate=0.625 (the molar ratio=0.737).

In accordance with results of an investigation performed by the inventors of the present invention, when the flow rate of the carrier gases was made such that TMG/(TMG+TMA)=0.625 under the conditions when the results shown in FIG. 12 were obtained, the composition of the buffer layer was $Al_{0.9}Ga_{0.1}N$.

It s preferable that the AlaGa1-aN buffer layer has a structure that the composition ratio α of Al is 0.85 to 0.95, more preferably substantially 0.9.

Figure 13:
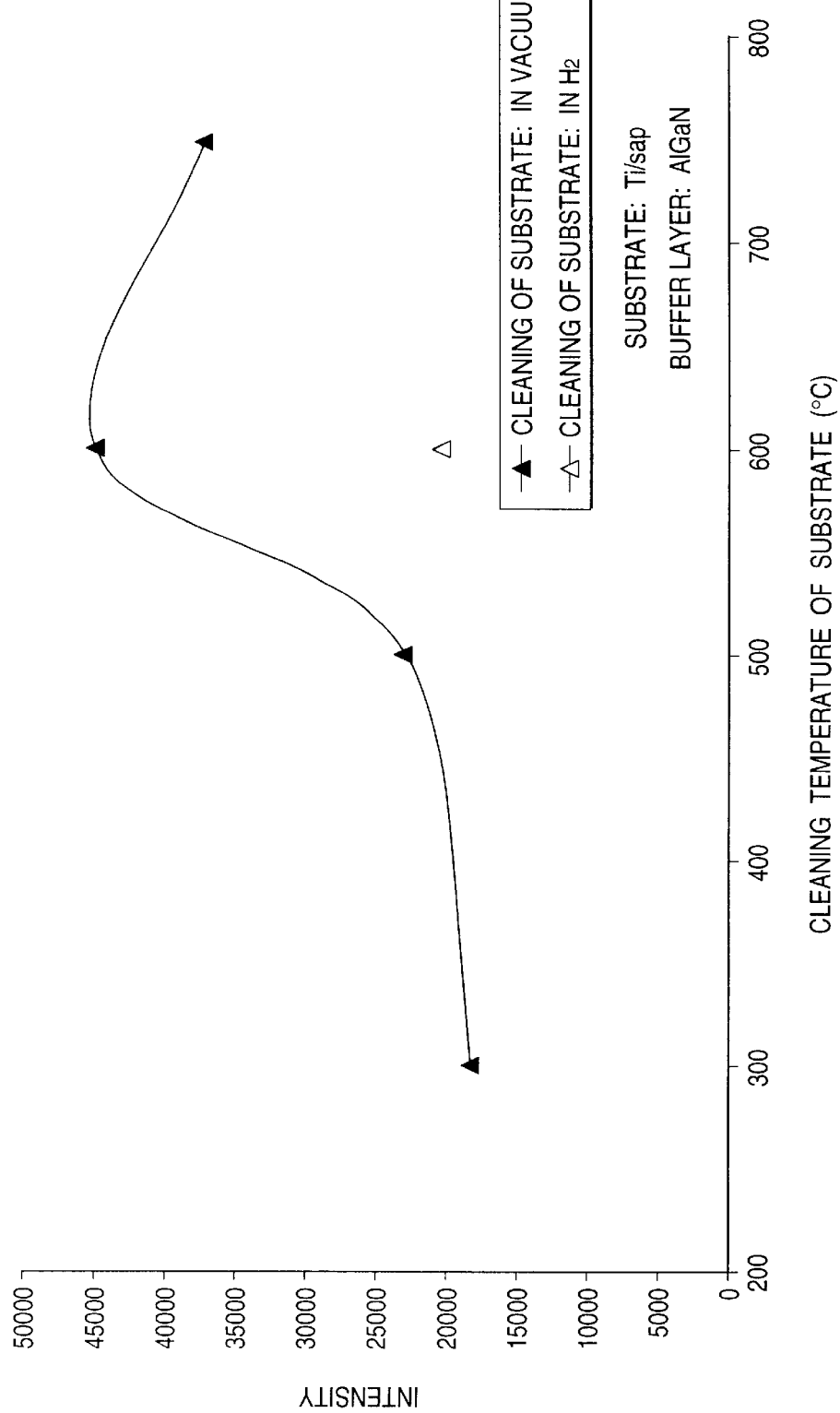
FIG. 13 is a graph showing the relationship between a temperature for thermal treatment of the Ti/sapphire and the crystallinity of GaN.

FIG. 13 shows the relationship between the cleaning temperature of the Ti/sapphire and the crystallinity of GaN. The axis of ordinate of the graph stands for average intensities (relative values) of six peaks obtained by the φ (PHI) scan similarly to that shown in FIG. 9.

The Ti layer was formed under the above-mentioned conditions. The AlGaN buffer layer and the GaN layer were formed under the same conditions as those shown in FIG. 8.

Results of cleaning indicated by closed triangles were obtained when a sapphire base layer on which Ti was evaporated was placed in the MOCVD chamber, the pressure of which was made to be vacuum (the degree of vacuum: $3 \times 10^{-5}$ Torr). Then, the lamp heater was turned on to heat the substrate to a predetermined temperature, and then the foregoing temperature was maintained for 5 minutes. Then, the substrate was cooled.

On the other hand, results of cleaning indicated by open triangles (Δ) were obtained when the sapphire base layer on which Ti layer was evaporated was placed in the MOCVD chamber to which hydrogen was supplied (atmospheric pressure in the chamber). Then, the lamp heater was turned on to heat the substrate to a predetermined level, and then the temperature was maintained for 5 minutes. Then, the substrate was cooled.

As can be understood from the results shown in FIG. 13, a GaN layer having satisfactory crystallinity can be obtained when Ti is heated in a vacuum so as to be treated thermally between evaporation of the Ti layer on the sapphire base layer and forming of the buffer layer.

It is preferable that the cleaning temperature is 500° C. to 750° C., more preferably 550° C. to 700° C. and most preferably 600° C. to 650° C.

The degree of vacuum required in the cleaning operation is not limited particularly. To sufficiently remove impurities from the Ti layer, it is preferable that the degree of vacuum must be raised as much as possible.

The combination of the sapphire base layer and the Ti layer has been described. It can be considered that similar results can be obtained from a structure in which a Ti layer is formed on a substrate made of Si or another material.

Figure 14:
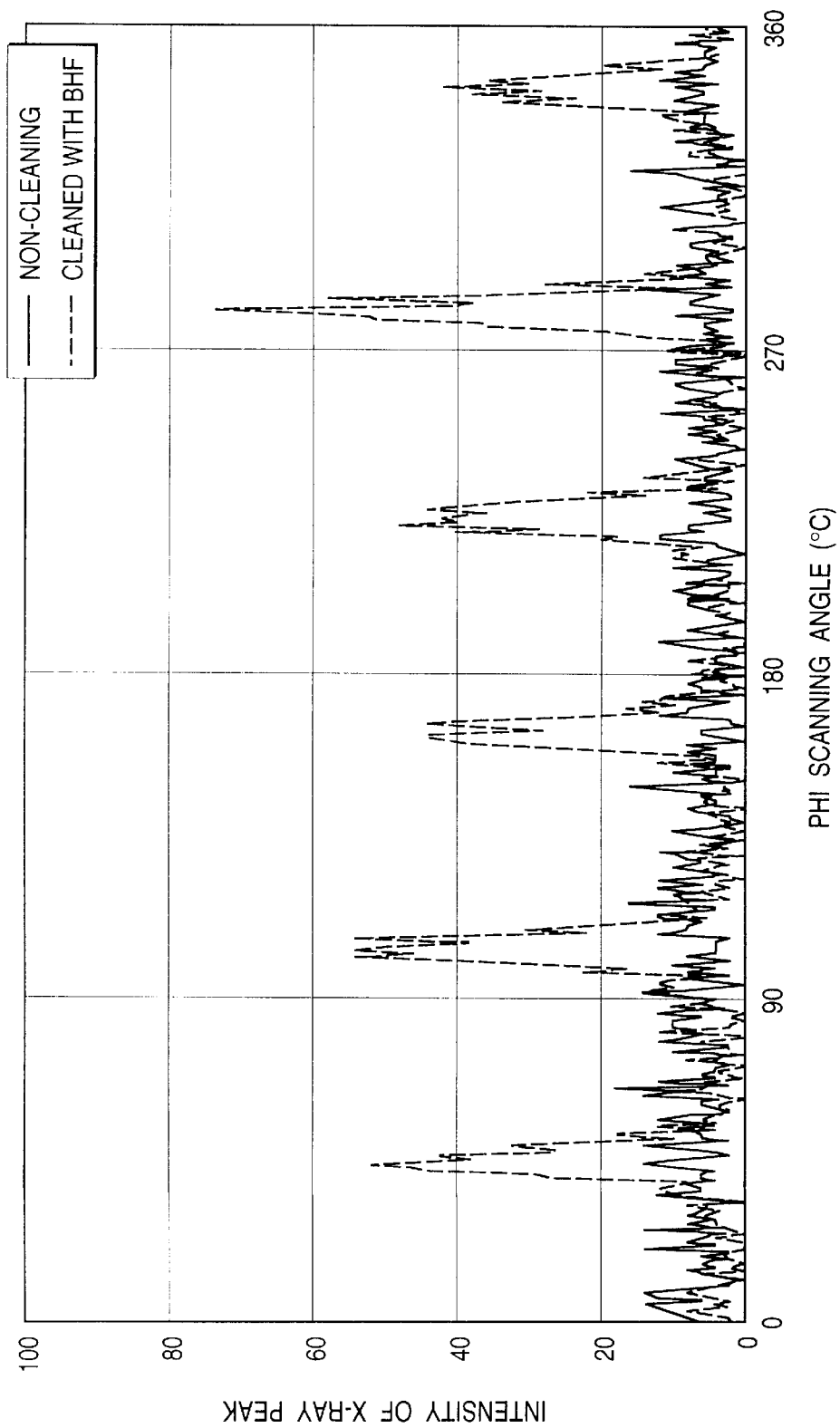
FIG. 14 is a chart showing results of φ (PHI) scan of the (101-2) plane of the Ti layer evaporated on the (111) plane of the Si substrate.

FIG. 14 shows dependency of the crystallinity of Ti evaporated on the (111) plane of the Si substrate on cleaning of wafer. Ti was evaporated under the following conditions (which are the same as those for the sapphire base layer):

Evaporating Speed: 0.5 nm/s

Evaporation Temperature: 150° C.

Thickness: 300 nm

Results of a process were indicated by a solid line shown in FIG. 14, the process being performed such that the Si base layer was subjected to nitrogen purge similarly to the process for the sapphire base layer so that oxygen was substantially removed from the inside portion of the chamber. Thus, a Ti layer was formed on the (111) plane. FIG. 14 shows results of φ (PHI) scan of the (101-2) plane of the Ti layer. A dashed line shown in FIG. 14 shows results of cleaning of the Si base layer with buffered hydrofluoric acid before the nitrogen purge is performed.

Figure 15:
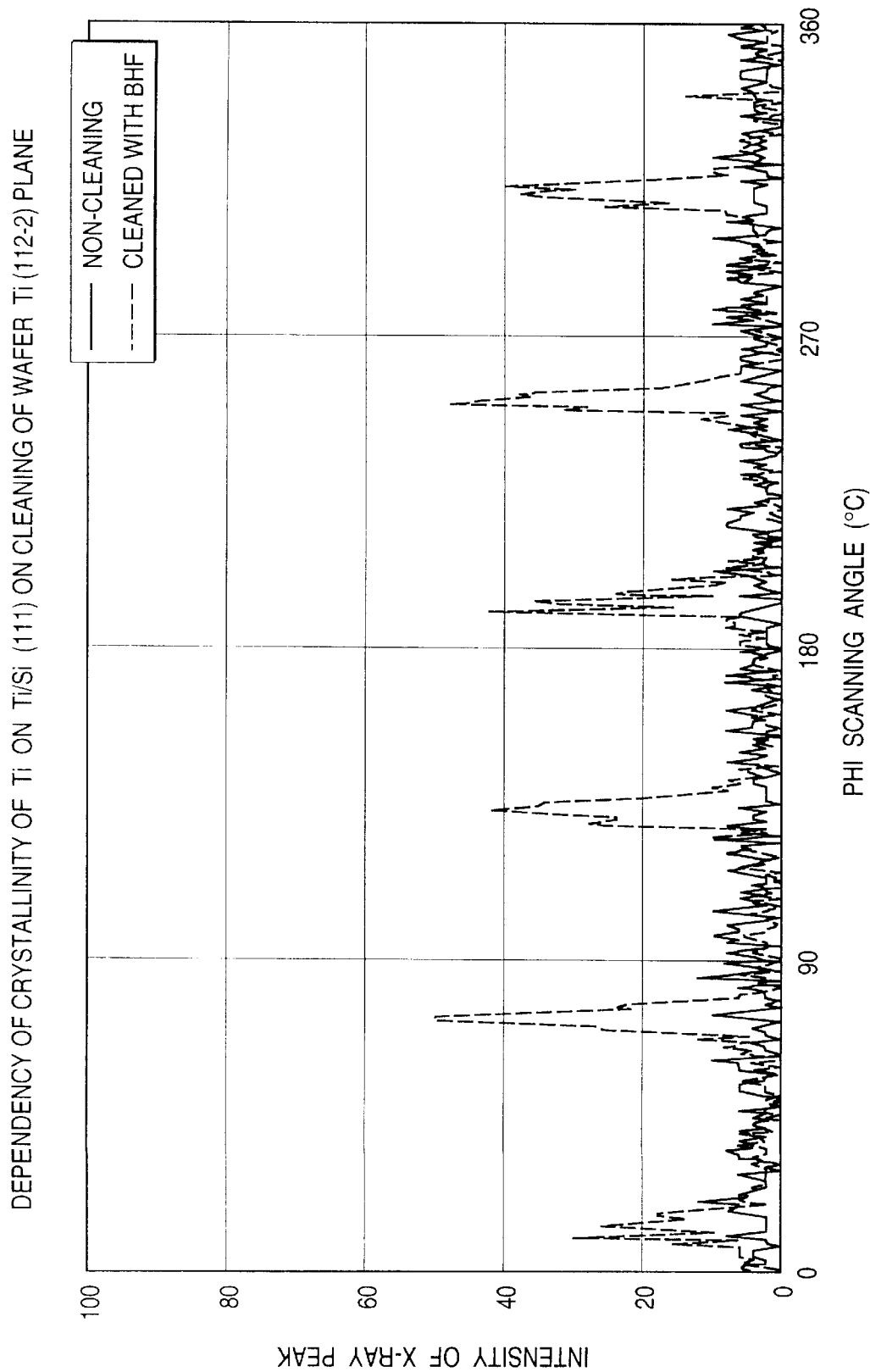
FIG. 15 is a chart showing results of φ (PHI) scan of the (112-2) plane of a sample Ti layer shown in FIG. 14.

FIG. 15 shows results of φ (PHI) scan of the (112-2) plane of the sample Ti layer.

As can be understood from the results shown in FIGS. 14 and 15, the Ti layer evaporated on the Si base layer previously cleaned with the buffered hydrofluoric acid has satisfactory crystallinity. On the other hand, the crystallinity of the Ti layer evaporated on the Si base layer by omitting the acid cleaning is unsatisfactory.

Figure 16:
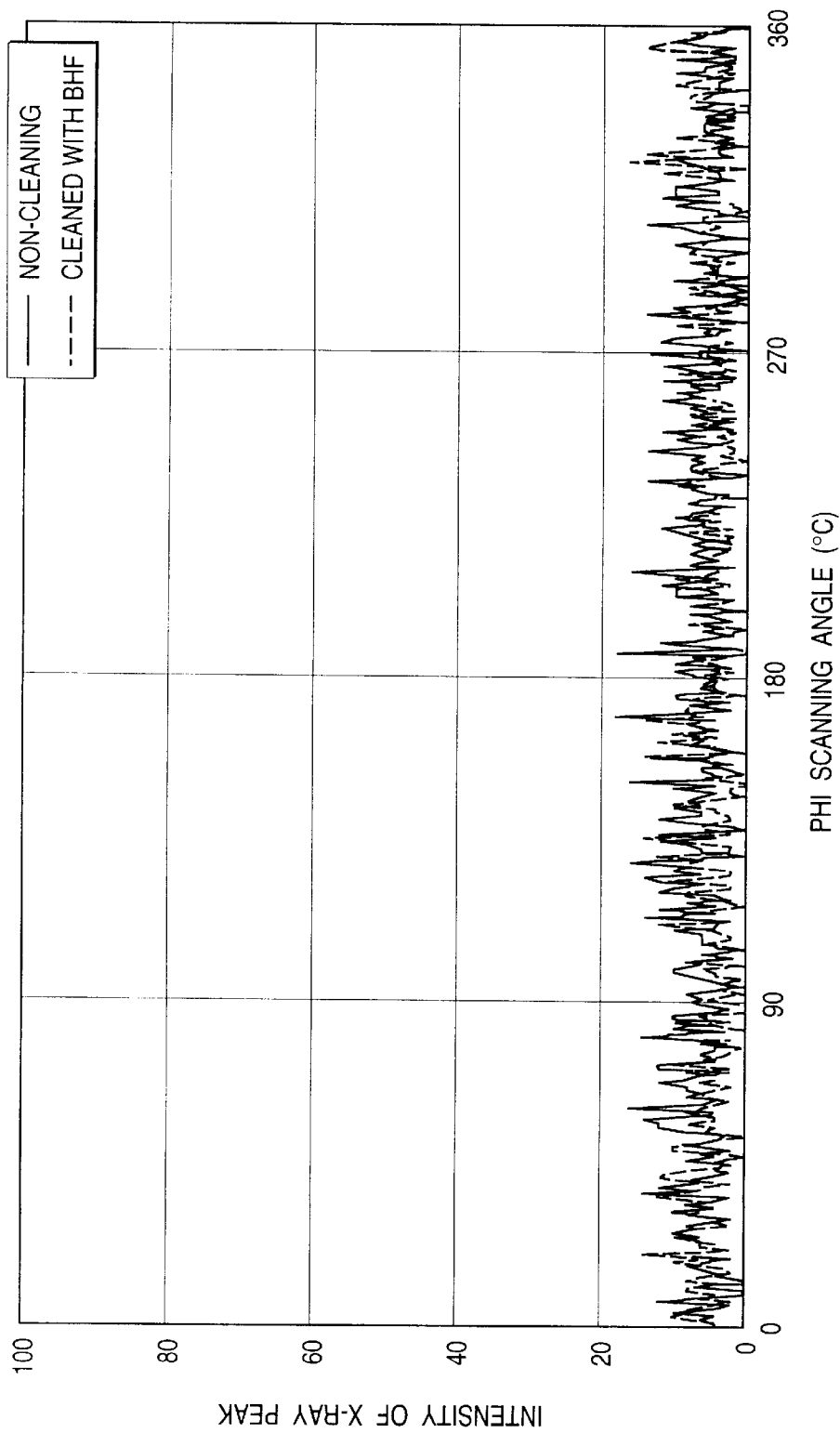
FIG. 16 is a chart showing results of φ (PHI) scan of the (101-2) plane of the Ti layer evaporated on the (100) plane of the Si base layer.

FIG. 16 shows results of φ (PHI) scan of the (101-2) plane of the Ti layer evaporated on the (100) plane of the Si base layer, similar to those shown in FIG. 14.

Figure 17:
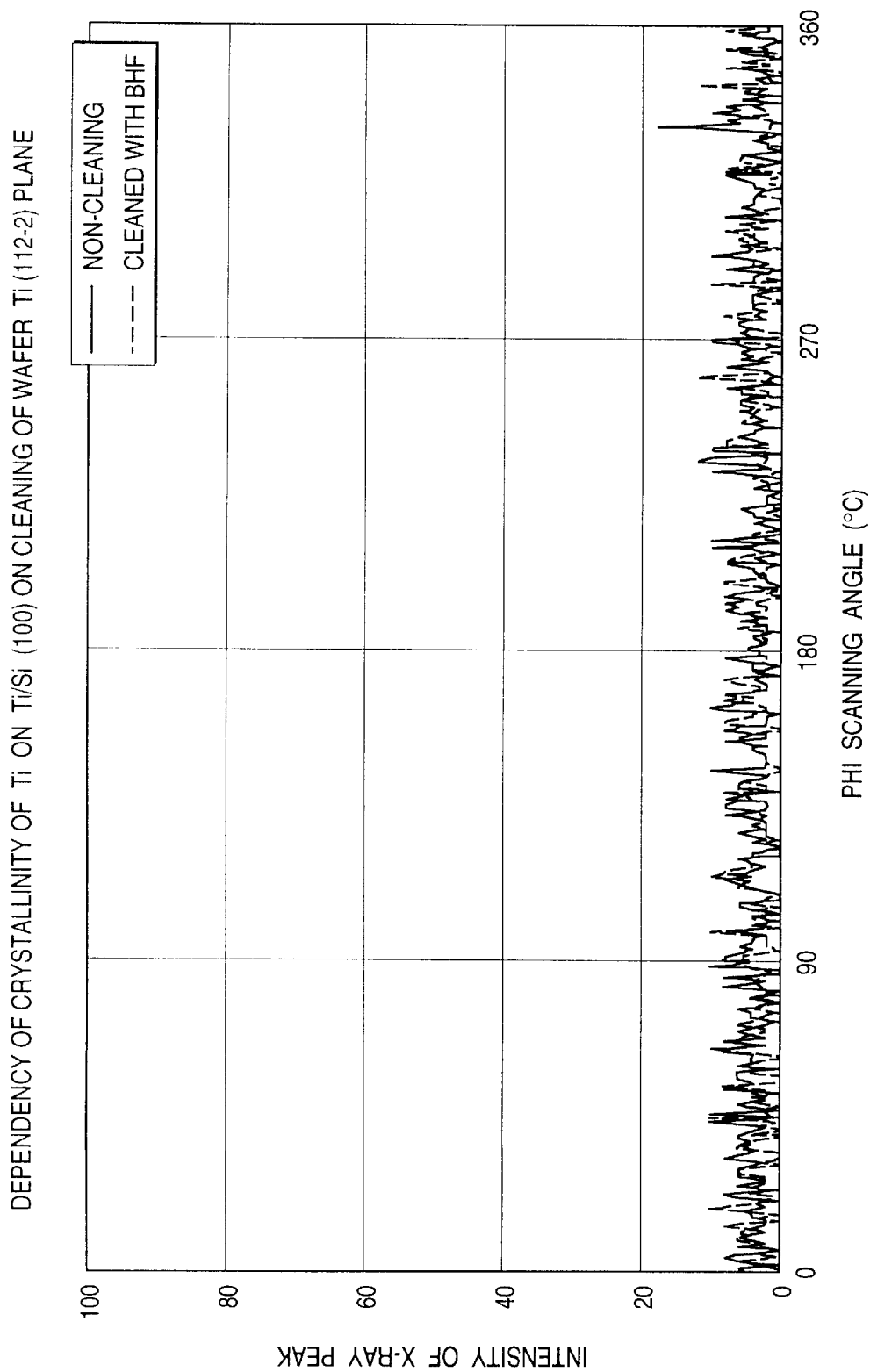
FIG. 17 is a chart showing results of φ (PHI) scan of the (112-2) plane of the sample Ti layer shown in FIG. 16.

FIG. 17 similarly shows results of φ (PHI) scan of the (112-2) plane of the Ti layer evaporated on the (100) plane of the Si substrate.

As can be understood from the results shown in FIGS. 16 and 17, the Ti layer evaporated on the (100) plane of the Si base layer has unsatisfactory crystallinity regardless of acid cleaning.

As can be understood from the results shown in FIGS. 14 to 17, the single crystal Ti layer can be formed on the Si base layer by evaporating Ti on the (111) plane of the Si base layer and by previously cleaning the Si base layer with buffered hydrofluoric acid or hydrofluoric acid.

A first embodiment of the present invention will now be described.

Figure 18:
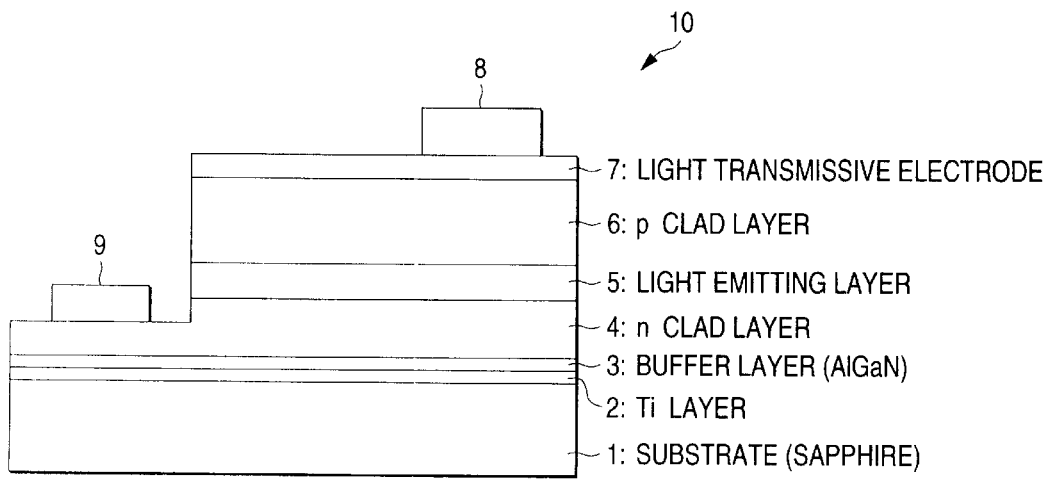
FIG. 18 is a cross sectional view showing the structure of a semiconductor device according to a first embodiment of the present invention.

In this embodiment, a light emitting diode 10 is described which has a structure as shown in FIG. 18.

Specifications of semiconductor layers are as follows:

| Layer | Composition | Dopant | (Thickness) |
|---|---|---|---|
| p Clad Layer 6 | p-GaN | Mg | (0.3 μm) |
| Light Emitting Layer 5 (Superlattice Structure) | | | |
| Quantum Well Layer | In0.15Ga0.85N | | (3.5 nm) |
| Barrier Layer (Number of Repetition of Quantum Well Layer and Barrier Layer: 1 to 10) | GaN | | (3.5 nm) |
| n Clad Layer 4 | n-GaN | Si | (4 μm) |
| Buffer Layer 3 | Al0.9Ga0.1N | | (15 nm) |
| Ti Layer 2 | Ti Single Crystal | | (300 nm) |
| Substrate 1 | Sapphire | | (300 μm) |

The n clad layer 4 may be formed into a double-layered structure consisting of a low electron density n layer adjacent to the light emitting layer 5 and a high electron density n⁺ layer adjacent to the buffer layer 3.

The structure of the light emitting layer 5 is not limited to the superlattice structure and it may be a single hetero structure, a double hetero structure or a homogeneous structure or the like.

An AlxInYGa1-x-YN (including X=0, Y=0 or X=Y=0) layer to which an acceptor, such as magnesium has been doped, and which has a wide band gap may be interposed between the light emitting layer 5 and the p clad layer 6. Thus, dispersion of electrons implanted into the light emitting layer 5 in the p clad layer 6 can be prevented.

The p clad layer 6 may be formed into a double-layered structure consisting of a low hall density p layer adjacent to the light emitting layer 5 and a high hall density p⁺ layer adjacent to the light transmissive electrode 7.

The process which is performed until the buffer layer 3 is formed is similar to that performed when the results shown in FIG. 10 were obtained.

Each of the GaN type semiconductor layers is formed by the known MOCVD method. The foregoing growing method is performed such that ammonia gas and alkyl compound gas of an element in a group III, for example, trimethyl gallium (TMG), trimethyl aluminum (TMA) or trimethylindium (TMI) are supplied to a substrate heated to an appropriate temperature so that a heat decomposition reaction of the supplied materials is performed. Thus, required crystal is grown on the substrate.

The transparent electrode 7 is in the form of a thin film containing gold. The electrode 7 is formed to cover substantially the overall upper surface of the p clad layer 6. Also the p electrode 8 is made of a material containing gold, the p electrode 8 being formed on the electrode 7 by evaporation.

The n electrode 9 is evaporated on the n clad layer 4.

Figure 19:
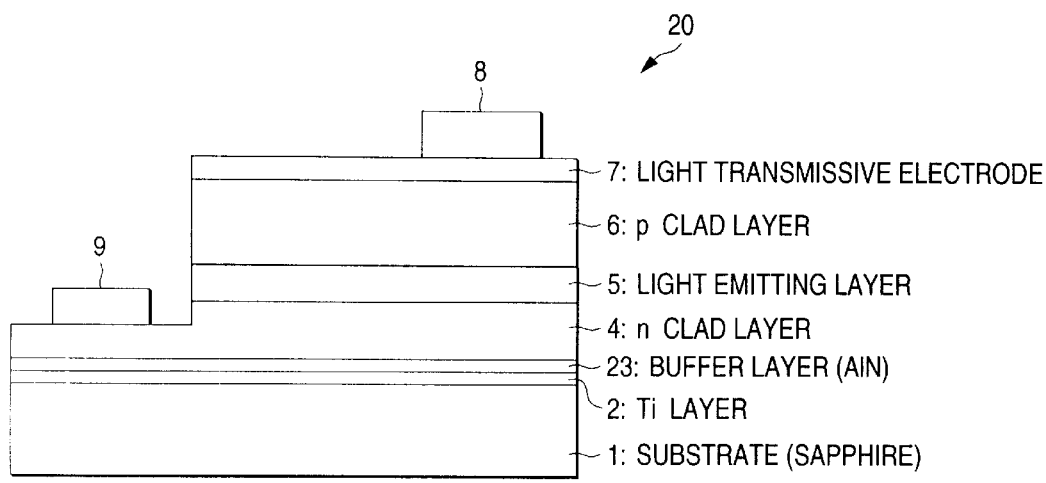
FIG. 19 is a cross sectional view showing the structure of a semiconductor device according to a second embodiment of the present invention.

FIG. 19 shows a semiconductor device according to a second embodiment of the present invention. The semiconductor device according to this embodiment is a light emitting diode 20. The same elements as those of the light emitting diode 10 shown in FIG. 18 and according to the first embodiment are given the same reference numerals and the same elements are omitted from description.

That is, the light emitting diode 20 according to this embodiment has a structure that the buffer layer 23 is made of AlN.

Figure 20:
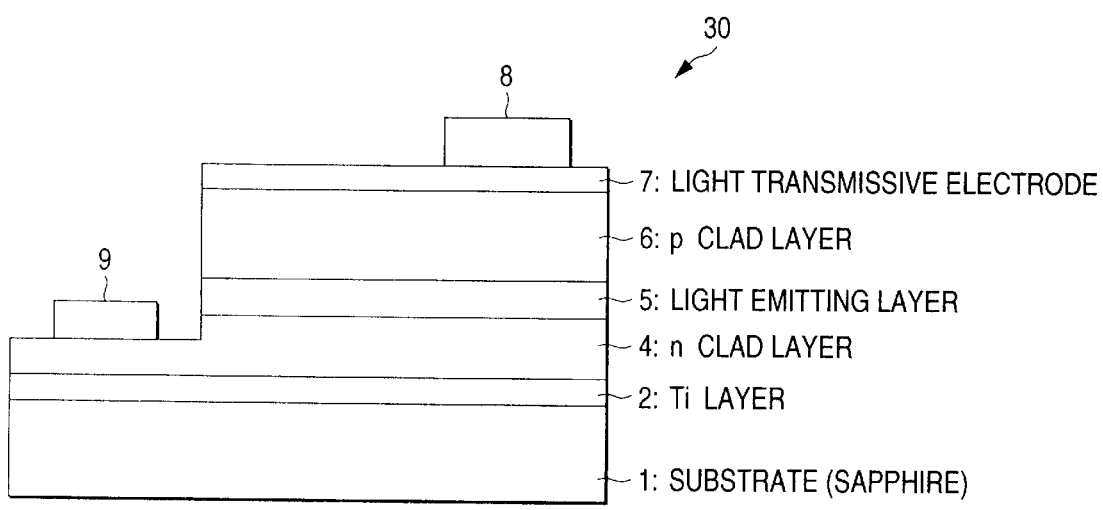
FIG. 20 is a cross sectional view showing the structure of a semiconductor device according to a third embodiment of the present invention.

FIG. 20 shows a semiconductor device according to a third embodiment of the present invention. The semiconductor device according to this embodiment is a light emitting diode 30. The same elements as those of the light emitting diode 10 shown in FIG. 18 and according to the first embodiment are given the same reference numerals and the same elements are omitted from description.

That is, the light emitting diode 30 according to this embodiment has a structure that the buffer layer is omitted. In this case, the n clad layer is formed by the MBE method.

Figure 21:
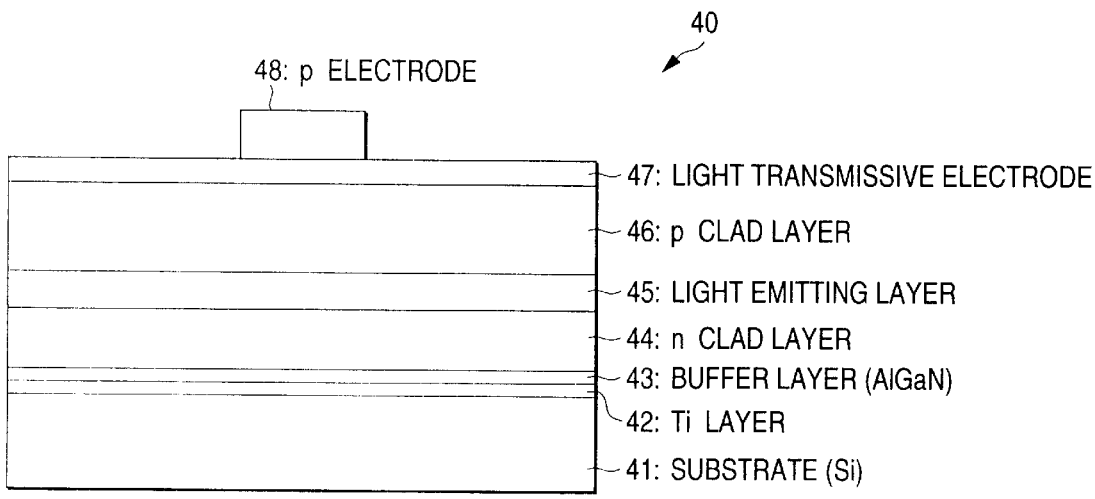
FIG. 21 is a cross sectional view showing the structure of a semiconductor device according to a fourth embodiment of the present invention.

FIG. 21 shows a semiconductor device according to a fourth embodiment of the present invention. The semiconductor device according to this embodiment is a light emitting diode 40.

Specifications of semiconductor layers are as follows:

| Layer | Composition | Dopant | (Thickness) |
|---|---|---|---|
| P Clad Layer 46 | p-GaN | Mg | (0.3 µm) |
| Light Emitting Layer 45 (Superlattice Structure) | | | |
| Quantum Well Layer | In0.15Ga0.85N | | (3.5 nm) |
| Barrier Layer (Number of Repetition of Quantum Well Layer and Barrier Layer: 1 to 10) | GaN | | (3.5 nm) |
| N Clad Layer 44 | n-GaN | Si | (4 µm) |
| Buffer Layer 43 | Al0.9Ga0.1N | | (15 nm) |
| Ti Layer 42 | Ti Single Crystal | | (300 nm) |
| Substrate 41 | Si (111) plane | | (300 µm) |

The AlGaN buffer layer 43 may be replaced by layer made of AlN similarly to the second embodiment. Similarly to the third embodiment, the buffer layer 43 may be omitted.

As described in the first embodiment, the GaN semiconductor layers 44 to 46 may be replaced by layers having other structures. Also the methods for forming the layers are similar to those according to the first embodiment. If the buffer layer is omitted, the GaN semiconductor layer adjacent to the Ti layer is formed by the MBE method.

In the foregoing process, the method of forming the Ti layer 42 is similar to that when the results indicated by the dashed line shown in FIG. 14 were obtained.

The AlGaN buffer layer 43 was formed similarly to the first embodiment.

The transparent electrode 47 is in the form of a thin film containing gold, the transparent electrode 47 being formed on substantially the overall upper surface of the p clad layer 46. Also the p electrode 48 is made of a material containing gold, the p electrode 48 being formed on the transparent electrode 47 by evaporation.

The substrate 41 can as it is be used as the n electrode.

Figure 22:
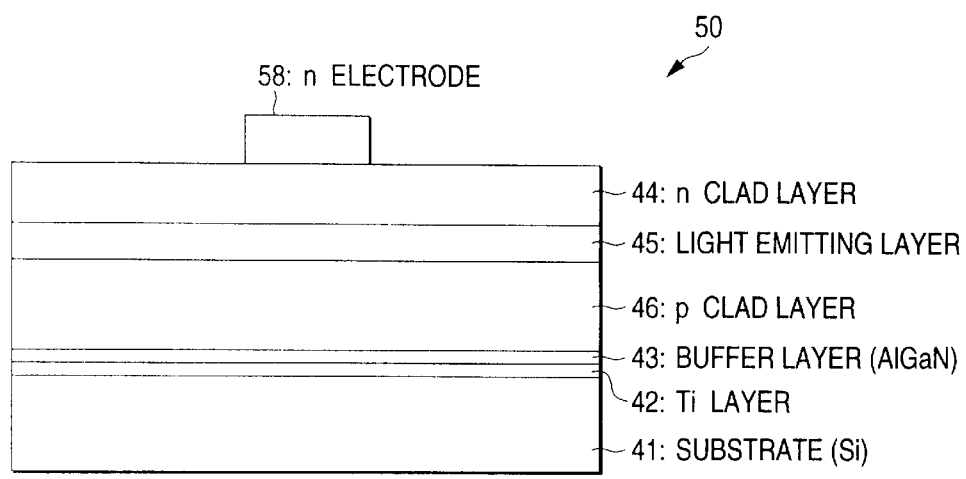
FIG. 22 is a cross sectional view showing a modification of the fourth embodiment of the present invention.

FIG. 22 shows a modification of the fourth embodiment. The same layers as those shown in FIG. 21 are given the same reference numerals and the same layers are omitted from description.

As shown in FIG. 22, the p clad layer 46, the light emitting layer 45 and the n clad layer 44 may sequentially be grown on the buffer layer 43 so as to constitute a light emitting device 50. Since the device 50 has the structure that the n clad layer 44 having low resistance forms the uppermost surface, the foregoing transparent electrode (reference numeral 47 shown in FIG. 21) have a possibility to be able to be omitted.

Reference numeral 58 in the drawing represents an n electrode. The base layer 41 can as it is be used as the p electrode.

The semiconductor device having the above-mentioned structure and according to the fourth embodiment has the structure that the Ti layer serves as a buffer layer for buffering stress. Therefore, a crack caused from the difference in the coefficient of thermal expansion between the Si base layer and the AlGaInN type semiconductor cannot substantially reach the GaN semiconductor layer.

The device to which the present invention is supplied is not limited to the above-mentioned light emitting diode. The present invention may be applied to a light device, such as a light receiving diode and a laser diode or an electronic device such as the FET structure.

Also the present invention may be applied to a laminated material which is an intermediate member of the foregoing device.

It is understood that the present disclosure of the preferred form can be changed in the details of construction and in the combination and arrangement of parts which can be carried out by an expert without departing from the spirit and the scope of the invention as claimed.

The following structures are disclosed:

(1) A method of forming substantially single crystal Ti layer on a sapphire base layer, comprising the steps of preparing a sapphire base layer; and evaporating or sputtering Ti on the sapphire base layer in an environment from which oxygen has substantially been removed.

(2) A method according to structure (1), wherein speed at which the Ti layer is formed is 0.5 nm/s or higher.

(3) A method according to structure (1), wherein a temperature at which the Ti layer is formed is substantially 250° C.

(4) A method according to structure (1), wherein a temperature at which the Ti layer is formed is room temperature to 150° C.

(5) A method according to any one of structures (1) to (4), wherein the thickness of the Ti layer is 100 nm to 1500 nm.

(6) A method according to any one of structures (1) to (4), wherein the thickness of the Ti layer is 200 nm to 1000 nm.

(7) A method according to any one of structures (1) to (6), wherein the surrounding environment from which oxygen has been removed is realized by making the inside portion of a chamber of an evaporating apparatus to be a vacuum, by performing a process for filling the chamber with inert gas one or a plurality of times and by making the inside portion of the chamber to be a vacuum.

(8) A method of forming a substantially single crystal Ti layer on a Si substrate, comprising the steps of:
preparing a Si base layer;
cleaning the Si base layer with acid; and
forming Ti on the (111) plane of the Si base layer in a surrounding environment from which oxygen has substantially been removed.

(9) A method according to a structure (8), wherein the acid cleaning is performed with solution containing hydrofluoric acid or buffered hydrofluoric acid.

(10) A method according to structure (8) or (9), wherein speed at which the Ti layer is formed is 0.5 nm/s or higher.

(11) A method according to structure (8) or (9), wherein a temperature at which the Ti layer is formed is room temperature to 250° C.

(12) A method according to structure (8) or (9), wherein a temperature at which the Ti layer is formed is about 150° C.

(13) A method according to any one of structures (8) to (12), wherein the thickness of the Ti layer is 100 nm to 1500 nm.

(14) A method according to any one of structures (8) to (12), wherein the thickness of the Ti layer is 200 nm to 1000 nm.

(15) A method according to any one of structures (8) to (14), wherein the surrounding environment from which oxygen has been removed is realized by making the inside portion of a chamber of an evaporating apparatus to be a vacuum, by performing a process for filling the chamber with inert gas one or a plurality of times and by making the inside portion of the chamber to be a vacuum.

(16) A method of growing a GaN type semiconductor layer, comprising the step for heating Ti single crystal surface at a reduced pressure before a GaN type semiconductor layer is formed on the Ti single crystal surface.

(17) A method according to structure (16), wherein a heating temperature is 500° C. to 750° C.

(18) A method according to structure (17), wherein a heating temperature is 550° C. to 700° C.

(19) A method according to structure (16), wherein a heating temperature is 600° C. to 650° C.

What is claimed is:

1. A GaN semiconductor and/or its related material's device comprising:

an AlGaInN type semiconductor layer; and
a substrate having a surface which is opposite to said semiconductor layer and which is made of Ti.

2. A semiconductor device according to claim 1, wherein said substrate has a base material, and at least one of a single crystal Ti layer and a substantially single crystal Ti layer.

3. A semiconductor device according to claim 2, wherein said base material comprises at least one of the members selected from the group consisting of Si, GaP, GaAs, InP, ZnSe and ZnO.

4. A semiconductor device according to claim 1, wherein further comprising a buffer layer made of $Al_aIn_bGa_{1-a-b}N$ (including a=0, b=0 or a=b=0) being interposed between said semiconductor layer and said substrate.

5. A laminated structure comprising:

a GaN semiconductor layer; and
a substrate having a surface which is opposite to said semiconductor layer and which is made of Ti.

6. A laminated structure according to claim 5, wherein said substrate has a base layer, and one of a single crystal Ti layer and a substantially single crystal Ti layer.

7. A laminated structure according to claim 6, wherein said base layer comprises at least one of the members selected from the group consisting of Si, GaP, GaAs, InP, ZnSe and ZnO.

8. A laminated structure according to claim 5, further comprising a buffer layer made of $Al_aIn_bGa_{1-a-b}N$ (including a=0, b=0 or a=b=0) interposed between said semiconductor layer and said substrate.

* * * * *